US008468940B2

(12) United States Patent
Luetke et al.

(10) Patent No.: US 8,468,940 B2
(45) Date of Patent: Jun. 25, 2013

(54) APPARATUS AND PROCESS FOR EXPOSING A PRINTING FORM HAVING A CYLINDRICAL SUPPORT

(75) Inventors: Helmut Luetke, Frankfurt am Main (DE); Rolf Schwan, Schiesheim (DE); Volker Struewe, Dietzenbach (DE)

(73) Assignee: E. I. du Pont de Nemours and Company, Wilmington, DE (US)

( * ) Notice: Subject to any disclaimer, the term of this patent is extended or adjusted under 35 U.S.C. 154(b) by 974 days.

(21) Appl. No.: 12/487,815

(22) Filed: Jun. 19, 2009

(65) Prior Publication Data
US 2010/0321663 A1   Dec. 23, 2010

(51) Int. Cl.
*B41C 3/08* (2006.01)
*B41N 6/00* (2006.01)

(52) U.S. Cl.
USPC ................... 101/401.1; 101/389.1

(58) Field of Classification Search
USPC ..... 355/70, 104, 110, 117, 53, 67; 101/401.1, 101/389.1
See application file for complete search history.

(56) References Cited

U.S. PATENT DOCUMENTS

| 3,170,381 | A | 2/1965 | Wanielista |
| 3,369,471 | A | 2/1968 | Fries et al. |
| 3,531,200 | A | 9/1970 | Moll |
| 3,998,159 | A * | 12/1976 | Lande ............... 101/131 |
| 4,215,928 | A | 8/1980 | Bayley et al. |
| 4,304,842 | A | 12/1981 | Schoute |
| 4,469,102 | A | 9/1984 | Fish |
| 4,619,050 | A | 10/1986 | Klemm |
| 4,674,507 | A | 6/1987 | Basso |
| 4,868,090 | A | 9/1989 | Kitamura et al. |
| 4,922,078 | A | 5/1990 | Ulrich et al. |
| 5,386,268 | A | 1/1995 | Ohlig et al. |
| 5,617,790 | A | 4/1997 | Chmielnik |
| 5,754,210 | A * | 5/1998 | Haneda et al. ........... 347/116 |
| 5,957,959 | A | 9/1999 | Rissmaney et al. |
| 5,983,800 | A | 11/1999 | Barral et al. |
| 6,931,992 | B1 | 8/2005 | Hull et al. |
| 2005/0170287 | A1 | 8/2005 | Kanga |
| 2007/0160934 | A1 | 7/2007 | Kanga |

FOREIGN PATENT DOCUMENTS

| DE | 2 603 082 | 8/1977 |
| EP | 0 614 125 A1 | 7/1994 |
| WO | WO 2008/034810 A2 | 3/2008 |
| WO | WO 2008/094607 A1 | 8/2008 |

* cited by examiner

*Primary Examiner* — Matthew G Marini
*Assistant Examiner* — Shema Freeman

(57) ABSTRACT

The invention pertains to a method and apparatus for exposing a cylindrical print sleeve. The method and apparatus can accommodate exposing various cylindrical print sleeves having different sleeve lengths and/or diameters. The apparatus includes a sleeve support for supporting the cylindrical print sleeve at one end, a plurality of light tubes supported in a longitudinal orientation, and a means for positioning the light tubes along one of a plurality of concentric rails to form a substantially circular wall of light tubes about the print sleeve.

15 Claims, 8 Drawing Sheets

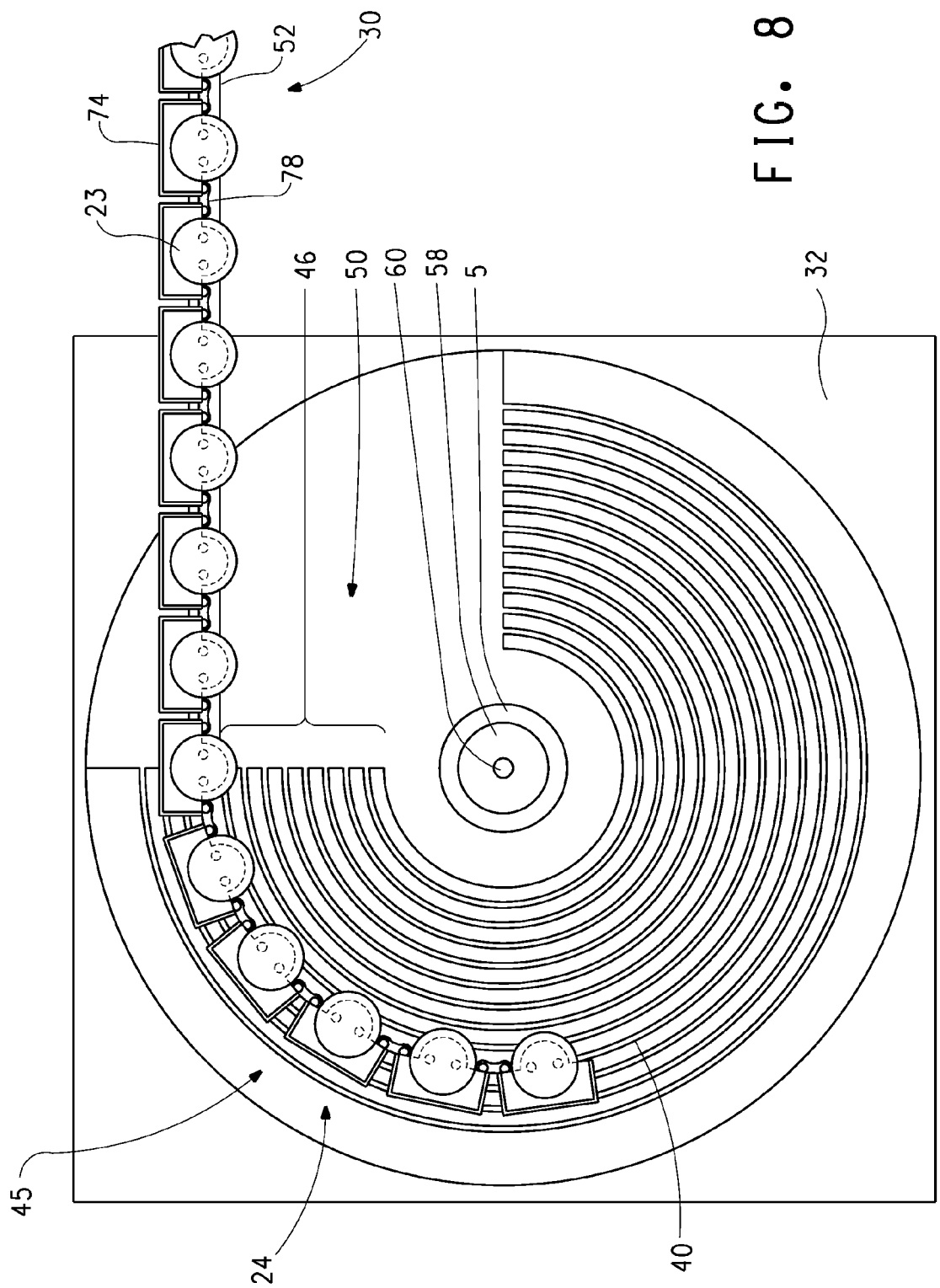

APPARATUS AND PROCESS FOR EXPOSING A PRINTING FORM HAVING A CYLINDRICAL SUPPORT

BACKGROUND OF THE INVENTION

1. Field of the Disclosure

This invention pertains to an apparatus and process for forming a printing form from a photosensitive element and, in particular, to an apparatus and process for exposing the printing form to actinic radiation and, more particularly, to an apparatus and process for exposing a cylindrically-shaped printing form.

2. Description of Related Art

Flexographic printing plates are well known for use in relief printing on a variety of substrates such as paper, corrugated board, films, foils and laminates. Flexographic printing plates can be prepared from photosensitive elements containing a layer of a photosensitive composition such as those described in U.S. Pat. Nos. 4,323,637 and 4,427,759. Photosensitive compositions, which may be referred to as photopolymerizable compositions, generally contain an elastomeric binder, at least one monomer, and a photoinitiator. Photosensitive elements generally have the layer of the photopolymerizable composition interposed between a support and a cover sheet or multilayer cover element. Upon imagewise exposure of the photosensitive element to actinic radiation, photopolymerization of the photosensitive composition occurs in the exposed areas, thereby curing and rendering insoluble the exposed areas of the layer. The element can be treated with a suitable solution, e.g., solvent or solvent mixture or aqueous-based solution, or treated thermally to remove areas of the photopolymerizable layer that were not exposed and leaving a printing relief which can be used for flexographic printing.

Although typically photosensitive elements for use in printing are used in sheet form, there are particular applications and advantages to using the printing element in a cylindrical form. Cylindrical printing elements have applications in flexographic printing of continuous designs such as in wallpaper, decoration and gift wrapping paper, and tight-fit conditions for registration, since the designs can be easily printed without print-through of the plate seam. Furthermore, such continuous printing elements are well-suited for mounting on laser exposure equipment where it can replace the drum or be mounted on the drum for digital imaging by laser exposure. Cylindrical printing elements can be continuous printing elements or seamless photopolymer sleeves that include at least a continuous layer of the photopolymerizable composition on a cylindrical support. Certain other applications use cylindrical printing elements that have one or more a planar or sheet-like photosensitive printing elements mounted onto a cylindrical support, which are often referred to as a plate-on-sleeves.

Oftentimes cylindrically-shaped photosensitive printing elements are exposed in flat-bed exposure apparatuses. Most commercial flat bed exposure apparatuses for cylindrical elements include two banks of tubular lights, each bank formed from a plurality of light tubes which form essentially a planar wall. A plurality of light tubes is necessary in order to achieve the actinic radiation energy necessary for photopolymerization of the photosensitive element to occur. The two banks of light tubes are spaced apart, opposite and parallel the other, and the cylindrical printing element which is supported at both its ends is located between the banks. In some cases, the position of one or both banks of tubes may be adjusted to create an appropriate space between the banks to accommodate exposing cylindrical printing elements with different diameters. The planar walls of light tubes can be parallel to the axis of the cylindrical printing element and typically extend beyond the diameter, i.e., width, of the cylindrical printing element. In some instances in these commercial exposure devices, each of the light tubes that form the wall has an axis that is parallel to the axis of the cylindrical printing element. In other instances, the light tubes that form the wall has an axis that is transverse to the axis of the cylindrical printing element (but still forming the planar wall). However, the distance from each of the light tubes of the bank in the first instance, or from any location on each of the light tubes of the bank in the second instance, to an exterior surface, i.e., periphery, of the cylindrical photosensitive element is different. The intensity of radiation from each of the light tubes impinging the photosensitive element is not the same due to the different distances from the each light tube to the exterior surface. Since intensity of light changes with the square of the distance between a light source and an impinging surface, even small differences in distances of the tubes to the exterior surface can significantly impact intensity and angle of the radiation impinging the photosensitive element. This may result in relatively long exposure times, exposed portions of the photosensitive element that are poorly polymerized, and/or poor quality of raised surface elements of the relief image, particularly for cylindrical photosensitive elements having relatively large diameters. These problems can be exacerbated in exposure apparatus in which the light tubes have aged and thus no longer emit at their maximum (ultraviolet) radiation.

Another problem associated with these flat-bed exposure devices is that the device typically has a large foot print, i.e., consumes a large portion of the floor area in operations. Examples of commercial flat bed exposure devices for cylindrical printing forms are available from The DuPont Company (Wilmington, Del.) by the CYREL® round Exposure Unit and the CYREL® round Light-finisher Unit. In some other commercial systems, the exposure device for the cylindrically-shaped photosensitive element is part of a multi-station automated system that not only exposes, but also treats, i.e., washes-out, and dries the element in series to produce the printing form. These exposure units have similar problems to the flat-bed exposure apparatuses described above. Additionally in these multi-station automated systems, ends of the cylindrical photosensitive element can not be covered and protected from radiation entering the ends and interior of the element and causing uncontrolled polymerization effects.

In addition there are other commercial exposure devices, so called rotary exposure devices, that include in a lid or top portion of a housing a bank of a plurality of light tubes forming a partial cylindrical wall that is parallel to the axis of the cylindrically-shaped photosensitive element. Several of these rotary exposure devices can accommodate holding cylindrical photosensitive elements within a range of diameters. But typically the bank of light tubes does not change position to maintain a constant distance from the bank to the exterior surface of the cylindrically-shaped photosensitive element, for exposing cylindrical photosensitive elements with different diameters. Oftentimes, the time of exposure is adjusted in the rotary exposure devices, as well as the flat-bed exposure devices, to accommodate cylindrically photosensitive elements of different diameters. But changing the time of exposure impacts production capability of the device, and can influence the quality of the exposed photosensitive element. If the amount of impinging actinic radiation energy is insufficient due to shortened exposure time, the photopolymerization process does not proceed as required for the photosensitive element.

In addition to the possible different diameters, cylindrically-shaped photosensitive elements have an axial length that can also differ from one element to another element. In both the flat-bed and the rotary exposure devices, the cylindrically-shaped photosensitive element can be horizontally mounted in the device by positioning each end of the axial length in a holder, which can take additional time to assure that the cylindrical element is symmetrically positioned, i.e., not skewed, and securely supported by the holders. Depending upon the size and weight of the cylindrical photosensitive element, it may require two operators to handle and mount the element into the rotary exposure apparatus.

As such, it can be difficult to establish and maintain conditions in an exposure device to provide consistent quality of actinic radiation impinging cylindrically-shaped photosensitive elements. And in particular it can be difficult to accommodate various cylindrical printing elements having different diameters and different lengths and provide consistent quality of the actinic radiation in an exposure device. The quality of the polymerization of photosensitive elements from the exposure depends on the actinic radiation energy, exposure time, and angle of the radiation. If the actinic radiation energy impinging the photosensitive element is too low, polymerization reaction may not start at all or may not occur deep enough in the layer of material which impacts the shape of small raised printing elements of the relief image. If the actinic radiation energy impinging the photosensitive element is too high such that the exposure time becomes very short, the shape of the raised printing elements is also poor. The raised printing elements have a shoulder, which is a portion of the raised printing element that transitions from a flat printing area to a sidewall, which becomes too steep, and small dots or lines do not have sufficient base and can easily chip away during printing.

Therefore, there is a need to overcome the problems of related art and to provide an improved exposure apparatus for cylindrically-shaped photosensitive elements. In particular, there is a need for an exposure apparatus that can easily accommodate various cylindrically-shaped photosensitive elements having different diameters and lengths. The exposure apparatus should also ensure safe and quick positioning of cylindrically-shaped printing elements of different lengths. Additionally, there is a need for an exposure apparatus that can provide consistent or substantially consistent intensity of the actinic radiation impinging the exterior surface of the cylindrically-shaped photosensitive element, regardless of the diameter and length of the cylindrical element.

SUMMARY

The present invention provides a circular exposure unit for a cylindrical print sleeve having a longitudinal axis comprising a base and a plurality of light tubes. The base comprises a circular rail having an open end and disposed substantially around a sleeve support, the sleeve support positioned in a center of the base and adapted to support the print sleeve at one end thereof so that the longitudinal axis is oriented orthogonal to the base. The plurality of light tubes supported in a longitudinal orientation parallel to the longitudinal axis by bottom mounts is fastened to means for positioning the light tubes along the circular rail to form a circular wall of tubes, the positioning means supported on a bottom rail having one end thereof positioned adjacent the open end of the circular rail.

The invention also provides a method for exposing a cylindrical print sleeve having a longitudinal axis and an exterior surface. The method comprises supporting one end of the print sleeve on a sleeve support positioned in a center of a base having a circular rail with an open end; supporting a plurality of light tubes in a longitudinal orientation parallel to the longitudinal axis on bottom mounts moveably supported on a bottom rail having one end positioned adjacent the open end of the circular rail; moving the mounts along the bottom rail and into the open end of the circular rail so that the light tubes substantially surround the sleeve support; and energizing the light tubes to emit radiation onto the exterior surface.

BRIEF DESCRIPTION OF THE DRAWINGS

FIG. 8 is a schematic cross-sectional view from a top side of the exposure apparatus showing a plurality of light tubes moving from a first location to a second location at the exposure station along one circular rail of a plurality of circular rails, each light tube connected to an adjacent light tube by the chain.

DESCRIPTION OF THE PREFERRED EMBODIMENT(S)

Figure 1:
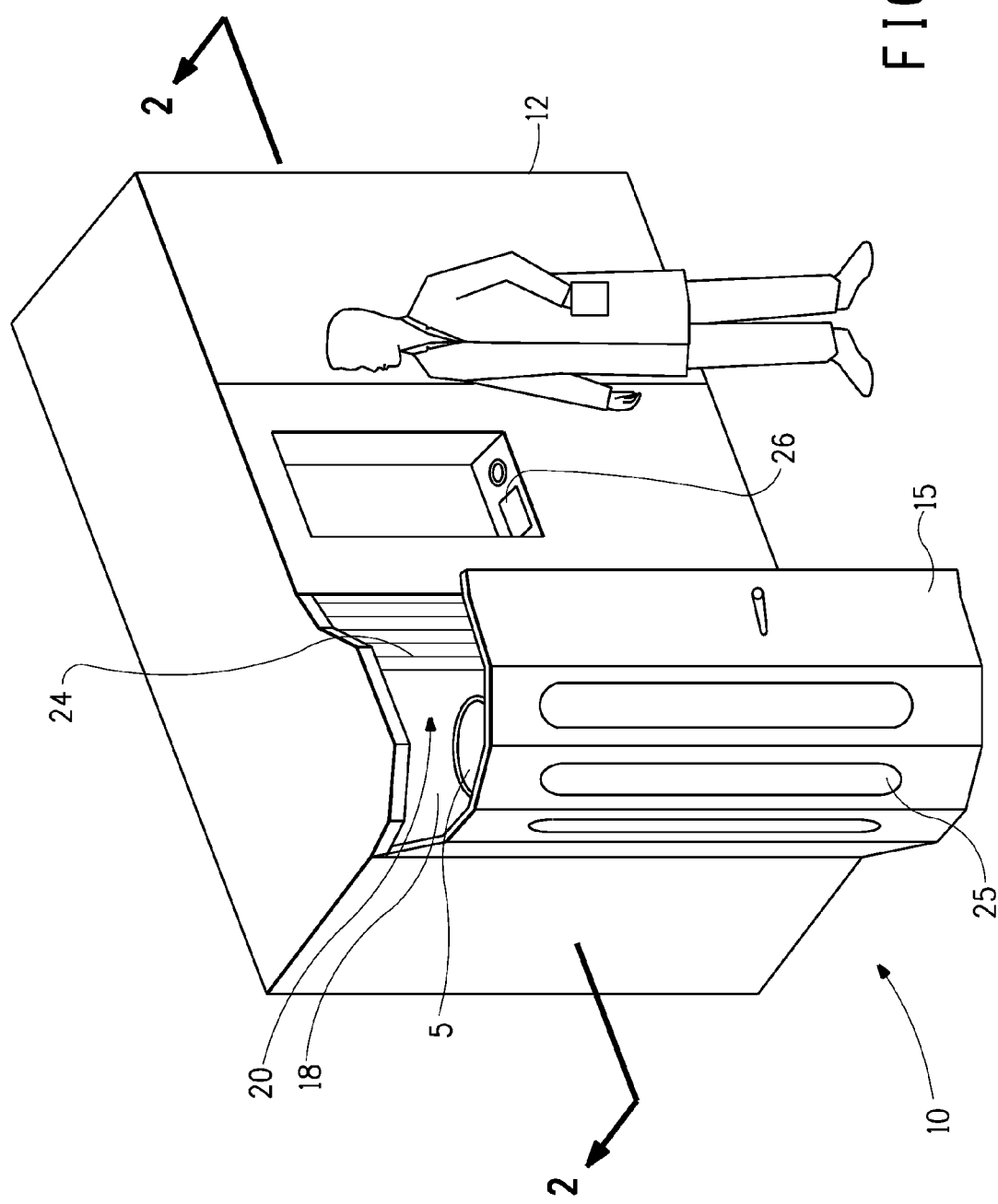
FIG. 1 is a perspective front view of one embodiment of an apparatus for exposing cylindrical print sleeves according to the present invention, showing a housing having a door on a front to provide access to an interior of the apparatus.

Throughout the following detailed description, similar reference characters refer to similar elements in all figures of the drawings.

The present invention provides an apparatus and method for exposing a cylindrically-shaped photosensitive element, which may also be referred to herein as a cylindrical print sleeve, or a print sleeve. The apparatus may also be referred to herein as a circular exposure unit, or an exposure apparatus. The present exposure apparatus and method may be used for imagewise exposure, blanket or overall exposure, post-exposure, and/or light-finishing exposure of the cylindrical print sleeve. The present exposure apparatus can easily accommodate various cylindrically-shaped photosensitive elements having different diameters and lengths. The present invention provides an easy way to expose various cylindrical print sleeves each having different interior diameters on the same apparatus without the need for a specific support cylinder, i.e., drum, for each diameter. The exposure apparatus easily accommodates various cylindrical print sleeves each having different length of its longitudinal axis, since only one end of the longitudinal axis is supported. This provides an advantage in the reduction of tooling for the apparatus and the simplification of the exposure method. The exposure apparatus also ensures safe and quick positioning of cylindrically-shaped printing elements of different lengths. The present invention also provides an easy and economical way to prepare cylindrical printing forms with different repeat lengths from cylindrical print sleeves having different diameters. The repeat length of a particular cylindrical photosensitive element is the distance from start to end of an image region on a printed substrate before the image region is repeated on the printed substrate. The repeat length can also be considered a circumference of an exterior surface, that is, the exterior perimeter (length) of the cylindrical print sleeve. Additionally, the present exposure apparatus can provide consistent or substantially consistent intensity of the actinic radiation impinging the exterior surface of the cylindrically-shaped print sleeve, regardless of the diameter and length of the cylindrical element. The present exposure apparatus also provides consistent or substantially consistent geometry of the actinic radiation impinging the exterior surface of the cylindrically-shaped print sleeve, regardless of the diameter and length of the cylindrical element, so that the quality of the image is consistent from one sleeve to another sleeve.

In accordance with the present invention the apparatus and method exposes cylindrical print sleeves having an association with a cylindrical shape or substantially cylindrical shape. That is, the support for the print sleeve itself may be cylindrical, or the print sleeve may be grouped with at least one other structure that is cylindrically shaped. Since the resulting print sleeve is ultimately mounted onto a printing cylinder, the shape of the support or structure is generally cylindrical. However, the print sleeve may not be cylindrical or may only be substantially cylindrically shaped while in operative engagement in the present apparatus and method or when not mounted onto the printing cylinder. The cylindrical print sleeve includes a support and a composition layer on or adjacent the support opposite an interior surface of the support. The print sleeve may include a continuous, seamless or substantially seamless, photopolymerizable composition layer adjacent to or on the cylindrically-shaped support. The print sleeve can also encompass plate-on-sleeve system. Typically, plate-on-sleeve includes at least a composition layer on a planar support, i.e., a plate, which is then mounted onto a cylindrically-shaped support. Ends of the plate may or may not meet or join when wrapped onto the sleeve. Plate-on-sleeve also includes an embodiment in which more than one plate, or portions of plates, are mounted onto a sleeve at various spaced locations. Also contemplated as the print sleeve is a printing plate or a photosensitive plate having at least one photopolymerizable composition layer preferably on a base support, which is formed into a cylinder by butt joining opposing edges. The plate edges can be joined by any method including, but not limited to, melt fusing, taping, stitching, clamping, stapling, gluing, and sewing. In this embodiment the base support would become the cylindrical support. Any of the embodiments described above, i.e., continuous printing form or plate-on-sleeve, may be referred to as a cylindrical print sleeve. The cylindrical print sleeve may also be referred to herein as a cylindrical print(ing) form, cylindrically-shaped print(ing) form, cylindrical print(ing) element, cylindrically-shaped print(ing) element, cylindrical photosensitive element, photosensitive element, print(ing) sleeve, or sleeve.

The cylindrical print sleeve is tubular, i.e., a hollow elongated cylinder, and has an axial length taken along a longitudinal axis running through the hollow of the sleeve. The axial length of the cylindrically-shaped print sleeve may also be referred to herein as a width of the sleeve. The print sleeve has a first end to a second end opposite the first end, the distance between which determines the axial length. The first end and the second end each have a side edge with a thickness that is or substantially is the total of the thicknesses of the photosensitive composition layer and the support, and any intervening layers. The print sleeve also has an interior surface, which in most embodiments is the support, having an interior diameter, and an exterior surface opposite the support. The exterior surface of the print sleeve determines an outer diameter of the print sleeve. A perimeter of the exterior surface of the print sleeve may be referred to as a repeat length. In some embodiments, the interior diameter of the print sleeve for use in the present exposure apparatus is from 5 to 50 cm. In other embodiments, the interior diameter of the print sleeve is from 10 to 30 cm. In some embodiments, the print sleeve, which is exposed in the present apparatus, may have a repeat length of about 25 to about 125 cm. In other embodiments, the repeat length of the print sleeve is from 30 to 100 cm.

The cylindrical print sleeve includes a composition layer that may be in an uncured state, a cured state, or in a partially cured state. In some embodiments, the cylindrical print sleeve includes a layer of a composition that is responsive to actinic radiation, i.e., photosensitive, and thus the composition layer of the print sleeve is uncured or not crosslinked, prior to exposure by the present invention. In some embodiments, the cylindrical print sleeve may include a mask on its exterior surface for exposure of the photosensitive composition layer to be an imagewise exposure. In other embodiments, the cylindrical print sleeve may be blanket exposed in the present apparatus to overall cure or crosslink the photosensitive composition layer. The overall cured print sleeve may be subsequently engraved to form a relief surface suitable for printing. In other embodiments, a relief surface on the cylindrical print sleeve may be exposed in the present apparatus to light-finish or detackify the relief surface formed from a layer of a photosensitive composition that was exposed to actinic radiation and thus cured, i.e., photohardened or crosslinked. In yet other embodiments, the cylindrical print sleeve includes a relief surface formed from a layer of a composition that was exposed to actinic radiation and is substantially cured, but is still responsive to actinic radiation, and thus may be exposed to actinic radiation by the present apparatus to complete curing, i.e., crosslinking, of the relief surface, which may be referred to as post-exposure.

FIG. 1 shows an apparatus 10 for exposing a cylindrical print sleeve 5 in accordance with the invention. The exposure apparatus 10 includes a housing 12 having on its front a door 15 to provide access to an interior 18 of the apparatus. An operator accesses the interior 18 to position the print sleeve 5 at an exposure station 20, by mounting the print sleeve on a sleeve support 22 prior to exposure, and de-mounting the print sleeve after exposure. The door 15 is closed at least when one or more light tubes 23 of a plurality of light tubes 24 are energized to expose the print sleeve 5 to actinic radiation at the exposure station 20. The housing 12 or door 15 may include one or more windows 25 to view the operation of the exposure apparatus 10. The exposure apparatus 10 includes a control panel 26 having a display and a series of selectors for entering information about the print sleeve 5 to be exposed, and for monitoring and controlling its operation.

Figure 2:
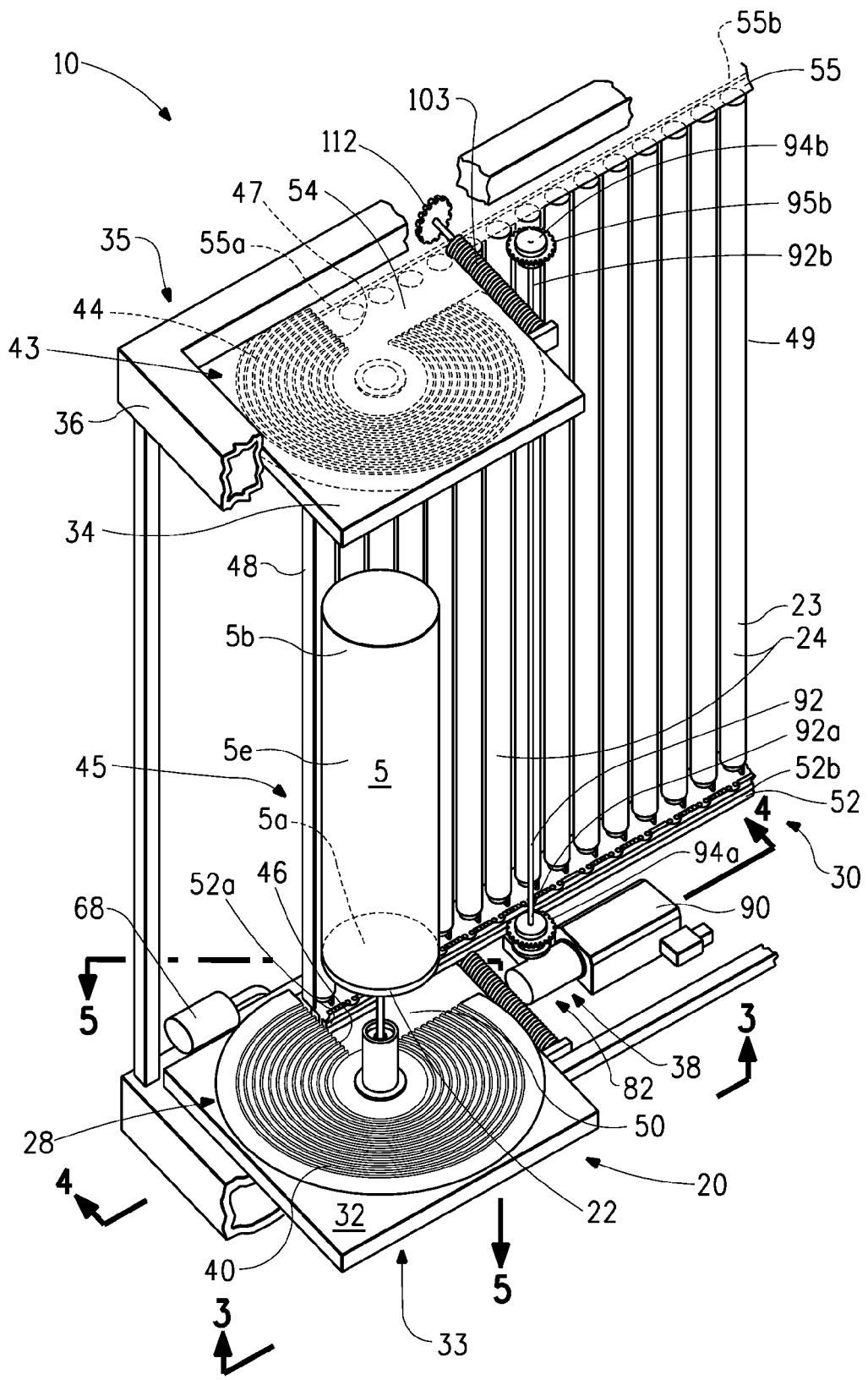
FIG. 2 is a schematic perspective front view, taken along section line 2-2 of FIG. 1, of one embodiment of the apparatus for exposing cylindrical print sleeves with the housing removed, showing a portion of the interior at an exposure station having a cylindrical print sleeve supported central to a base having a circular rail, a plurality of light tubes supported at a first location and in a longitudinal orientation parallel to the print sleeve, and a means for positioning the light tubes along the circular rail.

In FIG. 2, the housing 12 of the exposure apparatus 10 was removed to show a portion of the interior 18 having the exposure station 20 in which the cylindrical print sleeve 5 is mounted on a sleeve support 22 of a sleeve support assembly 28, and a plurality of light tubes 24 in a first location 30 adjacent the exposure station. The apparatus 10 has a base 32 at a bottom side 33 and a top 34 disposed opposite the base at a top side 35. The exposure station 20 is a location interior 18 to the housing 12 and between the base 32 and the top 34 that are separated at a distance sufficient to accommodate the axial length of the print sleeve 5 and the mounting and demounting of the print sleeve from the sleeve support 22. In the embodiment shown, the base 32 and the top 34 are each mounted to a frame 36 of the apparatus 10 to connect the top 34 to the base 32.

As shown in FIGS. 2 through 6, the apparatus 10 includes the sleeve support 22 of the sleeve support assembly 28 for supporting the cylindrical print sleeve 5 at one end 5a, the plurality of light tubes 24 supported at the first location 30 and in a longitudinal orientation, and a means for positioning 40 the light tubes 24 along a circular rail 40 of a plurality of concentric circular rails 42. The sleeve support 22 is positioned adjacent the base 32 having the plurality of concentric circular rails 42, such that the sleeve support 22 is centered relative to the plurality of concentric circular rails. The top 34 includes a plurality of concentric circular rails 43 (shown in phantom) that correspond to the plurality concentric circular rails 42 in the base 32 and are oriented to face the concentric circular rails 42 in the base 32. Unless otherwise indicated, the description of the base 32 including the plurality of concentric circular rails 42 is mirrored in the top 34. For simplicity, the plurality of concentric circular rails may be referred to as the plurality of concentric rails or the plurality of circular rails. The plurality of light tubes 24 can be positioned from the first location 30 to a second location 45, which may be referred to as an exposure location 45, along any one of the concentric rails of the base 32 and the corresponding concentric rail 44 of the top 34. The means for positioning 38 the plurality of light tubes 24 in any concentric rail 40 of the plurality of circular rails 42 provides the present apparatus with the capability to maintain constant or substantially constant a distance between the exterior surface 5e of the print sleeve 5 and each of the light tubes 23, regardless of the diameter of the print sleeve being exposed.

Each concentric rail 40 of the plurality of concentric rails 42 of the base 32 is a substantially circular rail 40 having an open end 46 that provides access for a leading end 48 of the plurality of light tubes 24 to enter or exit the circular rail 40. Each concentric rail 44 of the plurality of concentric rails 43 of the top 34 is a substantially circular rail 44 having an open end 47 that provides access for the leading end 48 of the plurality of light tubes 24 to enter or exit the circular rail 44. One rail of the plurality of concentric rails 42, 43 may be referred to as a concentric rail 40, 44 or a circular rail 40, 44. It should be understood that the circular rail 40, 44 need not form a complete circular path about the sleeve support. Each of the circular rails 40, 44 forms an arc substantially surrounding the sleeve support 22, of from about 90 degrees up to about 360 degrees as measured from the open end 46, 47. In the embodiment shown, the arc of each of the circular rails 40, 44 of the plurality of concentric rails 42, 43 is about 270 degrees as measured from the open end 46, 47. In this embodiment, the base 32 includes a recessed portion 50 in an area that does not include the plurality of concentric rails 42. The recessed portion 50 provides access for a rail 52 to locate the leading end 48 of the plurality of light tubes 24 to the open end 46 of the circular rail 40 of the plurality of concentric rails 42. The top 34 includes a recessed portion 54 in an area that does not include the plurality of concentric rails 43. The recessed portion 54 provides access for a rail 55 to locate the leading end 48 of the plurality of light tubes 24 to the open end 47 of the circular rail 44 of the plurality of concentric rails 43. In another embodiment where the arc of each of the circular rails 40, 44 is between about 270 and about 360 degrees, a separate path may be present in the base 32 and the top 34 for the plurality of light tubes 24 to gain access to the open end 46, 47 of the circular rail 40, 44. In the embodiment shown, each of the circular rails 40, 44 forms a groove that is recessed into or internal to a plane of the base 32 (and the top 34). In other embodiments, each of the circular rails 40, 44 can be a rib or track that is external to the plane of the base 32 (or top 34).

As shown in FIGS. 2 through 5, the sleeve support assembly 28 includes the sleeve support 22 and a means for rotating 56 the sleeve support. The print sleeve 5 is rotated at least during exposure to assure that the actinic radiation emitting from the plurality of light tubes 24 that surround print sleeve can overall uniformly or substantially uniformly impinge the exterior surface of the print sleeve 5. In one embodiment, the sleeve support 22 includes a platform 58 having a passage 59 for engaging a first end 60a of a shaft 60. The one end 5a of the print sleeve 5 mates with the platform 58 when the print sleeve is mounted in the apparatus 10. In one embodiment, the sleeve support 22, in particular the platform 58, is interchangeable in order to provide capability to appropriately accommodate mounting and supporting various print sleeves 5 having different inner diameters and/or thicknesses. The platform 58 may also be referred to as a sleeve holder 58. Near the first end 60a of the shaft 60 is a plate member 61 that is secured to the shaft orthogonally so that the platform 58 can reside on the plate member 61 with a portion of the first end of the shaft extending into the passage 59 of the platform sufficiently to retain the platform on the shaft when the print sleeve 5 is in place on the platform. In one embodiment, the platform 58 is removable from the shaft 60, and is replaced by another platform as needed to accommodate exposing of print sleeves 5 with different diameters and/or thicknesses in the present apparatus. In some embodiments, an o-ring is mounted on the plate member 61, or between the plate member 61 and the platform 58, to generate sufficient friction between the platform and the plate member so that the rotation of the shaft more readily transfers to rotate the platform carrying the print sleeve 5. In other embodiments, the plate member 61 has a surface adjacent the platform 58 that is sufficiently textured to generate friction between the platform and the plate member to translate the rotational motion of the plate member on the shaft to the platform carrying the print sleeve 5.

The platform 58 includes cylindrically-shaped band portion 62 that rises above a shoulder 64. The raised band portion 62 has an outer circumferential surface 65 perpendicular to the shoulder 64. The outer surface 65 of the band portion 62 can be smooth or textured. In some embodiments, the outer surface 65 of the band portion 62 is textured and may be roughed or knurled, or may have grooves or channels, or may have a pattern of grooves and channels. The raised band portion 62 has an outer diameter that corresponds to an inner diameter of the print sleeve 5, such that the one end 5a of the print sleeve 5 mates with the raised band portion 62 when positioned on the sleeve support 22. The shoulder 64 has a depth, as measured from the outer surface 65 of the raised band portion 62 to an outermost edge, which is sufficient to support the side edge of the end 5a of the print sleeve 5 and retain the print sleeve with its longitudinal axis in a vertical orientation on the platform 58. In most embodiments, the depth of the shoulder 64 is at least the same as the total thickness of the side edge of the print sleeve 5. The first end 5a of the print sleeve 5 mates with the raised band portion 62 with a slip fit to reside on the shoulder 64 of the platform 58 when mounted on the sleeve support 22. The present exposure apparatus 10 may include two or more independent platforms 58 each having different diameter of the raised band portion 62 and/or shoulder 64 depth that are interchangeable in the sleeve support assembly 28 in order to complement various print sleeves 5 having different diameters and/or thicknesses and accommodate their exposure.

Optionally prior to exposure, an end cover 63 may be positioned on the second end 5b of the print sleeve 5 that is opposite the end 5a of the print sleeve that is mated to the platform 58 of the sleeve support 22. In most embodiments, the end cover 63 is positioned on the second end 5b of the print sleeve 5. The end cover 63 prevents actinic radiation, e.g., ultraviolet radiation, from entering the interior, or hollow, space of the print sleeve 5 that can cause uncontrolled polymerization of the print sleeve from the interior, and from exposing an edge at the second end of the print sleeve. In some embodiments, the optional end cover may be same or similar to the platform 58 of the sleeve support 22 as described above and have the same or similar raised band portion 62 and shoulder 64. In some embodiments, the end cover 63 will have at least the same diameter and/or shoulder depth as the platform 58 of the sleeve support 22. In other embodiments, the end cover may be a disk or lid that resides on and covers the side edge of the print sleeve 5.

The shaft 60 of the sleeve support assembly 28 is sufficiently long to extend through a bearing housing 66 that is mounted on the base 32, and through a passage 67 in the base that is aligned with the bearing housing 66. The bearing housing 66 includes one or more bearings to allow the shaft 60 to rotate within the housing. The bearings and bearing housing are not limited provided that the combination can provide support to the rotating shaft 60. In some embodiments the bearing housing 66 is a journal bearing. In some embodiments, the plate member 61 is located on the shaft 60 such that the first end 5a of the print sleeve 5 when mounted on the platform 58 is about 15 cm above a lowermost end of the plurality of light tubes 24. In some embodiments, axial length of the print sleeve 5 is not centered relative to a length of the plurality of light tubes 24. In some embodiments, the axial length of the print sleeve 5 is centered or substantially centered about a length of the plurality of light tubes 24 when the print sleeve is mounted on the platform 58.

In the embodiment shown, the means for rotating 56 the sleeve support 22 includes a first motor 68 coupled to a first collared pulley 69a. A second collared pulley 69b is located on a side of the base 32 opposite the plurality of concentric rails 42, and aligned to the passage 67 in the base under the bearing housing 66. The second end 60b of the shaft 60 is coupled to the second collared pulley 69b with a set screw on the collar of the second pulley. A drive belt 70 wraps about the first collared pulley 69a and the second collared pulley 69b. To rotate the print sleeve 5 mounted on the sleeve support 22, the first motor 68 is energized rotating the first collared pulley 69a, and moving the drive belt 70 to rotate the second collared pulley 69b that is engaged with the shaft 60. In most embodiments, the print sleeve 5 is rotated on the sleeve support 22 of the sleeve support assembly 28 after the plurality of light tubes 24 is positioned in a predetermined circular rail. The means for rotating 56 the sleeve support 22 is not limited to the embodiment shown. Alternative embodiments of the means for rotating the sleeve support are within the skill of persons in the art, and can include, but are not limited to use of direct drive, and chain gears. The speed of the rotation of the print sleeve 5 on the sleeve support 22 is not particularly limited. In some embodiments, the print sleeve 5 rotates at about 1 to 15 rotations per minute. In most embodiments, the print sleeve 5 rotates at about 5 rotations per minute.

Figure 7:
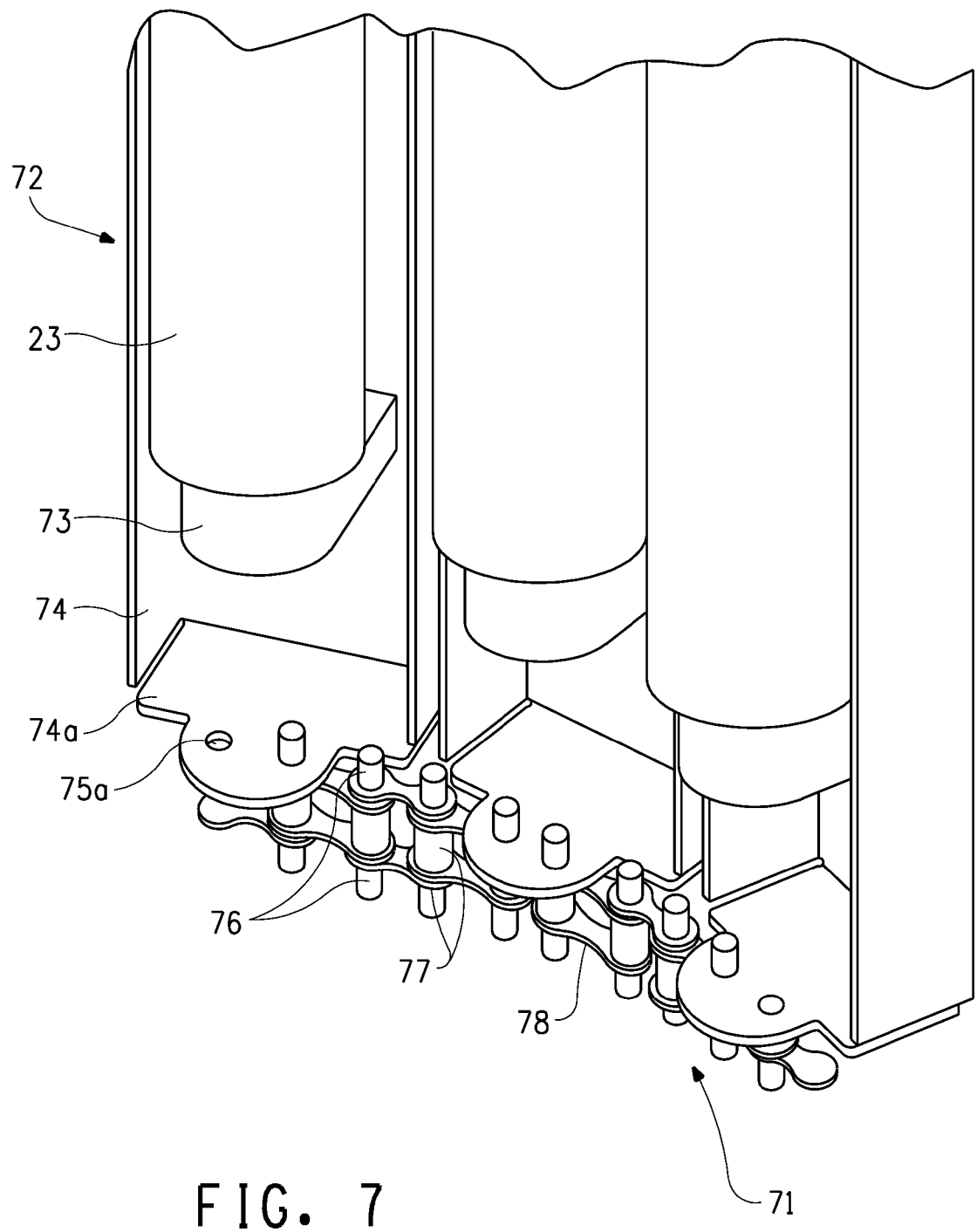
FIG. 7 is a schematic cutaway and close-up perspective front view of the bottom portion of one embodiment of the plurality of light tubes supported in the longitudinal orientation, each of which are mounted in a bracket that is movably fastened to links of the chain that is associated with the means for positioning the plurality of light tubes in the circular rail.

As shown in FIG. 2, the plurality of light tubes 24 is in the first location 30, which also may be referred to as a home location 30. In the embodiment shown, the plurality of light tubes 24 at the home location 30 creates a substantially planar wall of light tubes that are adjacent to and extend from the plurality of concentric rails 40, 42 from the base 32 and the top 34. Alternate embodiments are contemplated in which the plurality of light tubes 24 need not form a substantially planar wall at the home location 30, and can, for example, form a circular wall, a wall forming an arc, or even a spiral wall, at the home location. Each light tube 23 of the plurality of light tubes 24 has a longitudinal axis. In at least the exposure location 45, the plurality of light tubes 24 is supported in a longitudinal orientation in which the longitudinal axis of the light tubes is parallel or substantially parallel to the longitudinal axis of the print sleeve 5 (in position on the sleeve support). In the embodiment shown in FIGS. 2, 6, and 7, one embodiment of a means for positioning 38 the plurality of light tubes 24 uses a chain drive assembly 71 to move the plurality of light tubes 24 from the first location, i.e., home location 30, to the second location, i.e., exposure location 45, and optionally back again. At the exposure location 45, the plurality of light tubes 24 is located in one of the circular rails 40, 44 creating a substantially circular wall of light tubes that substantially surround the print sleeve 5.

In a light tube assembly 72, each light tube 23 of the plurality of light tubes 24 is mounted between two sockets 73 in a bracket 74 having a bottom end 74a and a top end 74b. The bottom end 74a of the bracket 74 has at least one hole 75a to mate with at least one pin 76 that fastens one link 77 to an adjacent link of a first chain 78 of the chain drive assembly 71. Similarly, but not shown, the top end of the bracket 74 also has at least one hole to mate with at least one pin that fastens one link to an adjacent link of a second chain of the chain drive assembly 71. The pins 76 of the first chain 78 and the pins 79 of the second chain 81 both have a portion of its length that extends upward and downward beyond the links 77, 80. The extended portions of the pins 76, 79 mate with holes 75a, 75b. The brackets 74 of each of the plurality of light tube assemblies 72 are appropriately spaced along the first chain 78 and the second chain 81 by mating the at least one hole 75a, 75b at each end 74a, 74b of the brackets to the at least one extended pin 76, 79 at the bottom end and top end of the brackets, so that each of the light tubes 23 can be maintained in the orientation parallel to the longitudinal axis print sleeve 5, and that each of the light tubes 23 in its respective bracket 74 can be oriented toward the exterior surface 5e of the print sleeve 5 along any one of the circular rails 40, 44 without binding with an adjacent bracket. As such, the links 77 of the first chain 78 are movably fastened to the bottom end 74a of the brackets, and, the links 80 of the second chain 81 are movably fastened to the top end 74b of the brackets. In some embodiments, the plurality of light tubes 24 includes from five to fifty light tubes assemblies 72, with each light tube 23 individually mounted on the separate bracket 74, and aligned adjacent to one another. In one embodiment, the plurality of light tubes 24 includes from at least twenty-two light tubes assemblies 72, with each light tube 23 individually mounted on the separate bracket 74, and aligned adjacent to one another.

In one embodiment, the means for positioning 38 the plurality of light tubes 24 includes the first chain 78 that is supported by the bottom rail 52, and a means for moving 82 the first chain 78 along the bottom rail and into the open end 46 of one of the circular rails 40 of the plurality of concentric rails 42. The bottom rail 52 has a first end 52a adjacent the open ends 46 of the plurality of concentric rails 42 of the base 32, and a second end 52b opposite the first end 52a that is pivotally mounted to the frame 36 of the apparatus 10. The pins 76 fastening the links 77 of the first chain 78 also extend downward below the links. The links 77 of the first chain 78 and the downward extended pins 76 reside within a channel 83 of a track 84 of the bottom rail 52. The bottom rail 52 and the first chain 78 at the bottom side 33 of the apparatus 10 are essentially mirrored by the top rail 55 and the second chain 81 at the top side 35 of the apparatus 10. The means for positioning 38 the plurality of light tubes 24 can further include the second chain 81 supported by the top rail 55. The top rail 55 has a first end 55a adjacent the open end 47 of the plurality of concentric rails 43 of the top 34, and a second end 55b opposite the first end 55a that is pivotally mounted to the frame 36 of the apparatus 10. The pins 79 fastening the links 80 of the second chain 81 extend upward from the links, so that the links and the upward extended pins reside within a channel 85 of a track (not shown) of the top rail 55. In the embodiment shown, the bottom rail 52 also include a rail frame 84a that supports or buttresses the track 84 along a length necessary to maintain the position or alignment of the plurality of light tubes 24 at the first location 30. The rail frame 84a essentially encloses the track 84 except for a side of the track that has the channel 83 in which the chain links 77 reside. The track 84 and rail frame 84a can be constructed of any material suitable to provide the desired functionality. In one embodiment, the track 84 is a plastic, such as nylon, and the rail frame 84a is metal. Similarly, the top rail 55 has the channel 85 in a track (not shown) with a rail frame (not shown) that is constructed the same as the bottom rail 52. Each of the bottom rail 52 and the top rail 55 has a slot 88 through a side of the rail 52, 55 to the channel 83, 85, i.e., through the rail frame 84a and part of the track 84, located between the first end 52a, 55a and the second end 52b, 55b of the rail.

The means for moving 82 the chain along the rail includes a second motor 90 coupled to a rotatable rod 92 having at least one sprocket wheel 94a mounted thereon that engages with the chain in the channel. In one embodiment, a bottom sprocket wheel 94a having teeth 95a is mounted at a first end of 92a the rod 92 so that the bottom sprocket wheel aligns with the slot 88 in the bottom rail 52, and at least portion of the bottom sprocket wheel 94a sufficiently recesses into the slot 88 for the teeth 95a of the sprocket wheel to mesh or engage with the links 77 of the first chain 78 residing in the channel 83. The engagement of the teeth 95a of the bottom sprocket wheel 94a with the links 77 of the first chain 78 in the channel 83 moves the first chain along the bottom rail 52. In the embodiment shown, the rotatable rod 92 extends between the bottom rail 52 and the top rail 55. A top sprocket wheel 94b having teeth 95b is mounted at a second end 92b of the rod 90 opposite first end 92a so that the top sprocket wheel 94b is aligned with the slot (not shown) in the top rail 55, and at least portion of the top sprocket wheel 94b is sufficiently recessed in the slot for the teeth of the sprocket wheel 94b to mesh or engage with the links 80 of the second chain 81 residing in the channel. The engagement of the teeth 95b of the top sprocket wheel 94b with the links 80 of the second chain 81 in the channel 85 moves the second chain 81 along the top rail 55. The rotation of the bottom sprocket wheel 94a and the top sprocket wheel 94b on the rotating rod 90 synchronously moves the first chain 78 along the bottom rail 52 and moves the second chain 81 along the top rail 55, so that the plurality of light tubes 24 are maintained orthogonal to the rails 52, 55 and in longitudinal orientation while moving from one location to another location. The sprocket wheels 94a, 94b are rotated on the rod 90 in one direction, e.g., counter-clockwise, to move the chains 78, 81 connecting to the plurality of light tubes 24 from the home location 30 to the exposure location 45. The direction of rotation of the sprocket wheels 94a, 94b on the rod 90 is reversed, e.g., clockwise direction, to move the chains 78, 81 connecting to the plurality of light tubes 24 from the exposure location 45 to the home location 30. The slot 88 is located between the first and second ends 52a, 52b of the bottom rail 52 (and similarly the slot is located between the first and second ends 55a, 55b of the top rail 55) in a position that assures that the chains 78, 81 will always be engaged by the teeth 95a, 95b of the respective sprocket wheel 94a, 94b regardless of the location of the plurality of light tubes 24.

In one embodiment of operation, the second motor 90 of the means for moving 82 the chain 78 (and 81) is energized to rotate the rod 90 and thereby rotate the bottom sprocket wheel 94a and the top sprocket wheel 94b in a direction that will position the plurality of light tubes 24 from the home location 30 to the exposure location 45. As the bottom and top sprocket wheels 94a, 94b rotate, the teeth 95a, 95b of the sprocket wheels engage the links 77, 80 of the first and second chains 78, 81 respectively, thereby moving the chains along their respective rail 52, 55 and the plurality of light tubes 24 into position. Since the first end 52a of the bottom rail 52 is aligned to the open end 46 of the circular rail 40 of the base 32, and, the first end 55a of the top rail 55 is aligned to the open end 47 of the corresponding circular rail 44 of the top 34, the first chain 78 moves along the channel 83 of the bottom rail 52 into the one circular rail 40 of the base 32 and the second chain 81 moves along the channel 85 of the top rail 55 into the circular rail 44 of the top 34, to position the plurality of light tubes 24 along the circular rails 40, 44. The first and second chains 78, 81 traverse the respective circular rail 40, 44 until the leading end 48 of the plurality of light tubes 24 reaches an end of the arc of the circular rails 40, 44 to form a circular or substantially circular wall of the light tubes (substantially surrounding the print sleeve 5) between the base 32 and the top 34. The leading end 48 of the plurality of light tubes 24 need not meet or abut with a trailing end 49 of the plurality of light tubes. In FIG. 8, the plurality of light tubes 24 is moving from the home location 30 to the exposure location 45, positioning the plurality light tubes 24 from the bottom rail 52 along the circular rail 40 (and although not shown from the top rail 55 along the circular rail 44). Although in most embodiments, the plurality of light tubes 24 is positioned along one of the circular rails 40, 44 by engaging both the bottom end 74a and the top end 74b of the bracket 74 for each of the light tube assemblies 72 in the chain drive assembly 71, alternate embodiments are contemplated in which only one end or the other end of the plurality of the light tubes, i.e., the bottom end or the top end of brackets of the light tube assemblies, is engaged for example by the chain drive, to position the light tubes to form a circular or substantially circular wall surrounding the print sleeve 5.

In some embodiments, all or substantially all of the plurality of light tubes 24 can reside in one of the circular rails 40, 44 at the exposure location 45. In other embodiments, particularly those in which the circular rail 40, 44 has a small diameter, less than all light tubes of the plurality of light tubes 24 can reside in the predetermined circular rail 40, 44 at the exposure location 45, and the remaining light tubes that are not positioned in the circular rail remain in the rail associated with the home location, i.e., bottom and top rails 52, 55. In any one embodiment of the exposure apparatus, seven to twenty-two light tubes of the plurality of light tubes 24 may reside in one of the circular rails. In both embodiments, the number of light tubes of the plurality of light tubes that resides in the predetermined circular rail will substantially surround the print sleeve 5. In embodiments when all light tubes of the plurality of light tubes 24 reside in the predetermined circular rail, a gap (not shown) is formed between the leading end 48 of the plurality of light tubes 24 and the trailing end 49 of the plurality of light tubes. In embodiments when less than all of the plurality of light tubes reside in the predetermined circular rail, a gap (not shown) is formed between the leading end 48 of the plurality of light tubes and the wall formed of the light tubes that remain on the bottom (and top) rail.

Instead of the chain drive assembly 71 as described above, alternate embodiments of the means for positioning 38 the plurality of light tubes 24 from the bottom rail 52 (and top rail 55) associated with the home location 30 to the circular rail 40 (and circular rail 44) are also contemplated and encompassed by the present invention. In one alternative embodiment, the end of the bracket for each of the light tubes of the plurality of light tubes is coupled to a spring-steel band or belt instead of the chain. At the open end of the rail, excess belt can form a roll which can be moved, i.e., by pushing or pulling action, to position the belt coupled with the plurality of light tubes to the desired location. In another alternative embodiment, the bracket ends of the plurality of light tubes are coupled to bendable plastic or rubber strip instead of the chain. In another alternative embodiment, the bracket ends of the plurality of light tubes are coupled to a toothed belt (with open ends) instead of the chain. A drive gear can be used to directly engage the toothed belt, or the bendable plastic or rubber strip, or the steel-spring belt or roll, to move the belt or strip coupled to the plurality of light tubes. The belt or strip would include a series of slots or holes or notches along its length to be directly engaged by the drive gear. It is also contemplated that a drive roller could be used to move the belt or strip by directly pressing the belt or strip. In another alternative embodiment of a mechanism to move the belt, strip, or chain is a push-arm assembly, which can be driven by a motor, hydraulics, or pneumatics.

The exposure apparatus 10 also includes a means for transferring 98 the plurality of light tubes 24 to the open end 46 (47) of one circular rail 40 (44) of the plurality of concentric rails 42 (43). The means for transferring 98 the plurality of light tubes 24 provides the capability to select one circular rail 46 from the plurality of concentric rails 42 possible, and thus appropriately position the plurality of light tubes 24 in the exposure location 45 relative to the print sleeve 5. Also by transferring the plurality of light tubes 24 to the open end 46 of one circular rail 40, the means for positioning 38 can then appropriately position the plurality of light tubes 24 from the home location 30 to the exposure location 45 (or from the exposure location to the home location). In most embodiments, the diameter of the print sleeve 5 essentially determines the selection of the particular circular rail 40 so that the distance between the print sleeve 5 and the surrounding light tubes 24 is maintained the same or substantially the same regardless of the diameter of the print sleeve being exposed. A constant distance between the exterior surface 5e of the print sleeve 5 and the number of light tubes of the plurality of light tubes 24 that substantially surrounds the print sleeve, allows for consistent exposure, i.e., intensity of radiation impinging the print sleeve, and time of exposure, from one print sleeve to another print sleeve that produces quality relief structure in the resulting print sleeve. In other embodiments, the distance between the exterior surface of the print sleeve and the light tubes need not be maintained between print sleeves of a first diameter versus second diameter different than the first diameter.

In most embodiments, the means for transferring 98 the plurality of light tubes 24 moves the first end 52a of the bottom rail 55 to the open end 46 of one circular rail 40 of the plurality of concentric rails 42 on the base 32, and moves the first end 55a of the top rail 55 to the open end 47 of one circular rail 44 of the plurality of concentric rails 43 on the top 34. In most embodiments, the first end 52a of the bottom rail 55 moves along a path orthogonal to the open ends 46 of the plurality of concentric rails 42 of the base 32, and the first end 55a of the top rail 55 moves along a path orthogonal to the open ends 47 of the plurality of concentric rails 43 in the top 34. The one circular rail 44 of the top 34 corresponds to the one circular rail 40 of the base 32. In some embodiments, the means for transferring 98 moves the rails 52, 55 from a position offset from plurality of concentric rails 42, 43 to the open end 46, 47 of one of the circular rails 40, 44. In some embodiments, the means for transferring 98 moves the rails 52, 55 from a position offset from the base 32 and the top 34 to the open end 46, 47 of one of the circular rails 40, 44. In most embodiments, the means for transferring 98 moves the bottom rail 52 (and top rail 55) from the open end 46 (47) of one circular rail 40 to the open end of another circular rail of the plurality of concentric rails 42 (43).

Figure 3:
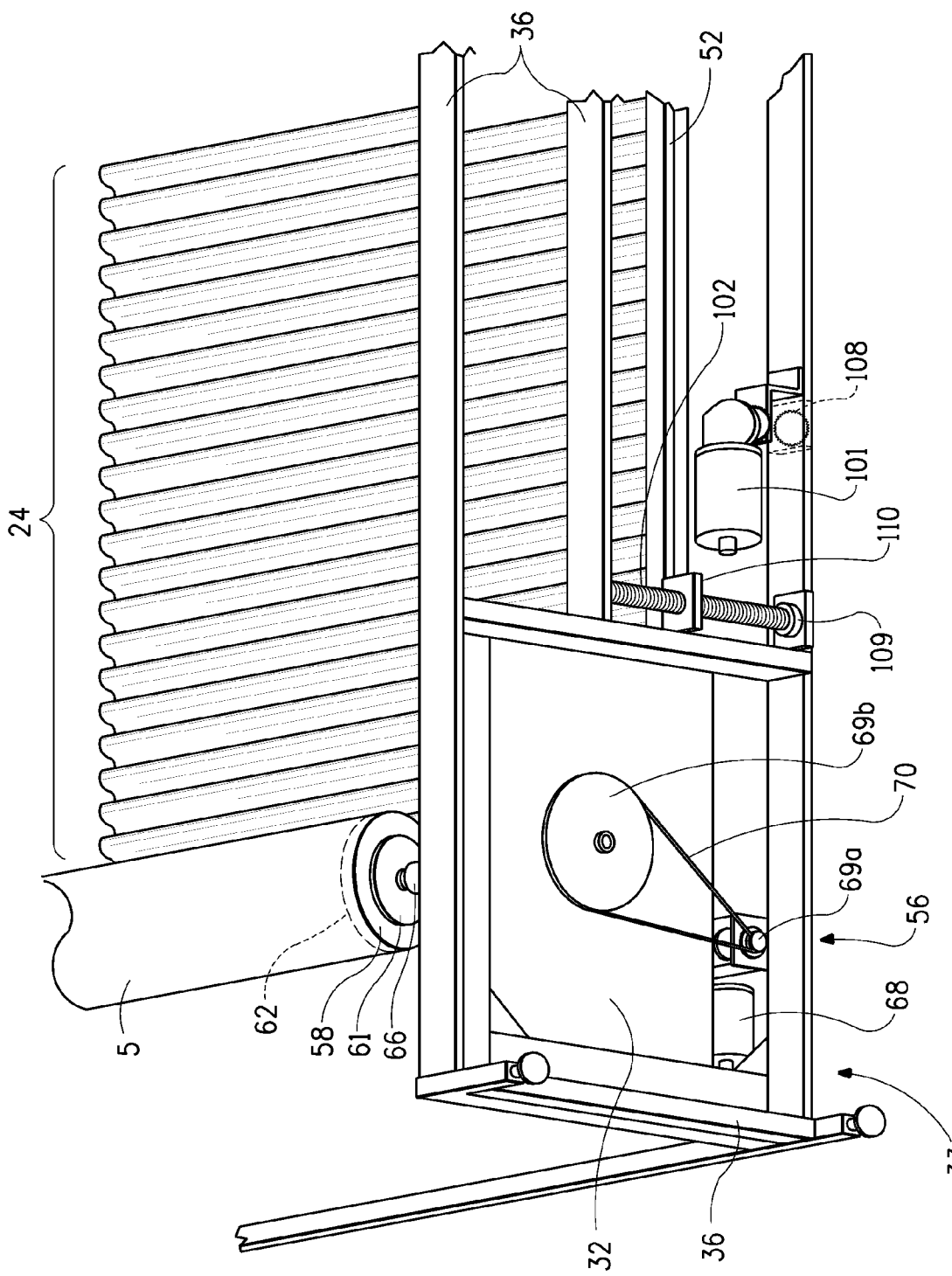
FIG. 3 is a schematic perspective view, taken along section line 3-3 of FIG. 2, of a bottom side of the exposure apparatus showing one embodiment of a means for rotating the cylindrical print sleeve on a sleeve support above the base.
Figure 4:
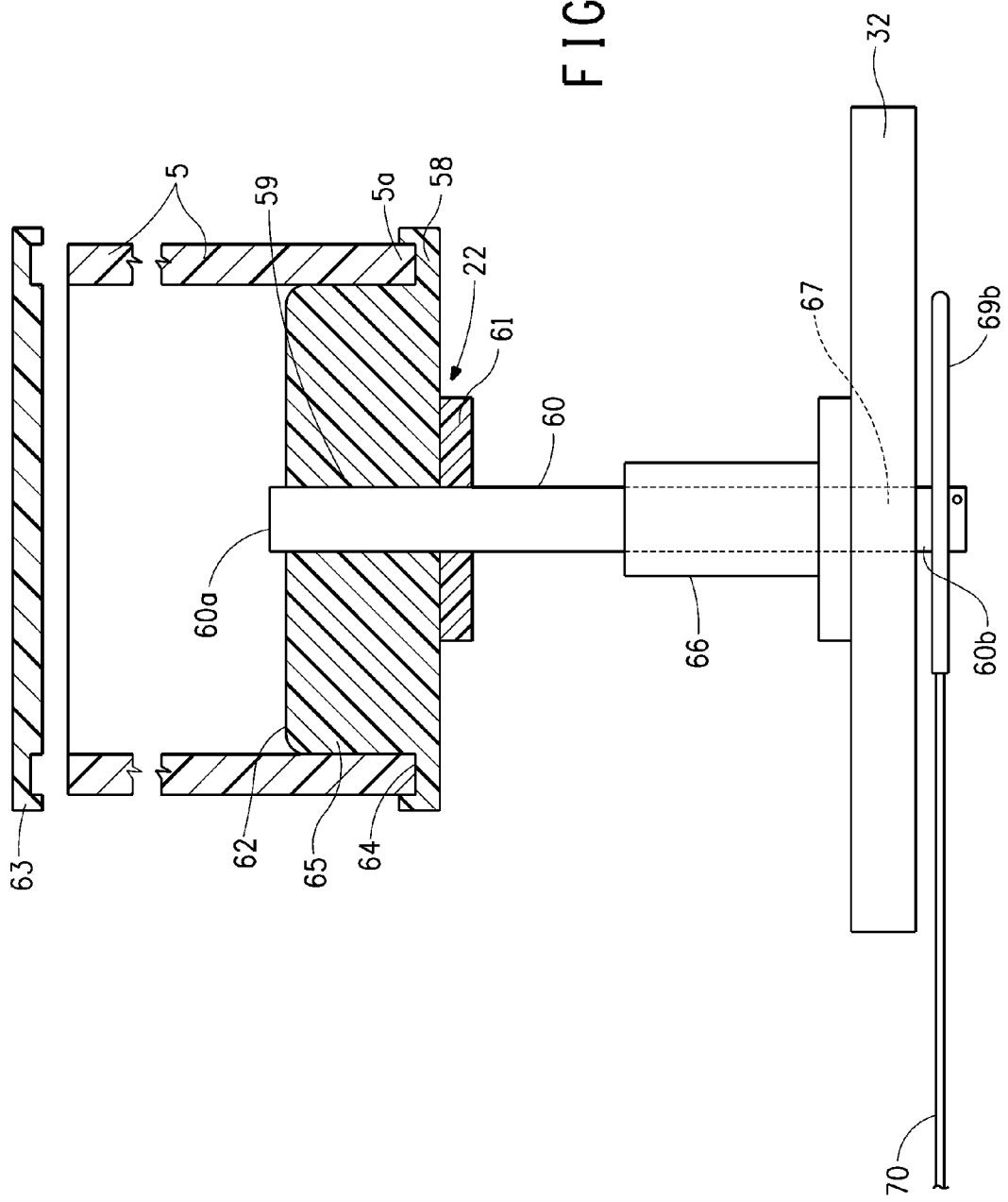
FIG. 4 is a schematic partial sectional view, taken along section line 4-4 of FIG. 2, of a sleeve support assembly having a sleeve support which engages with one end of the cylindrical print sleeve to mount the print sleeve in the apparatus.
Figure 5:
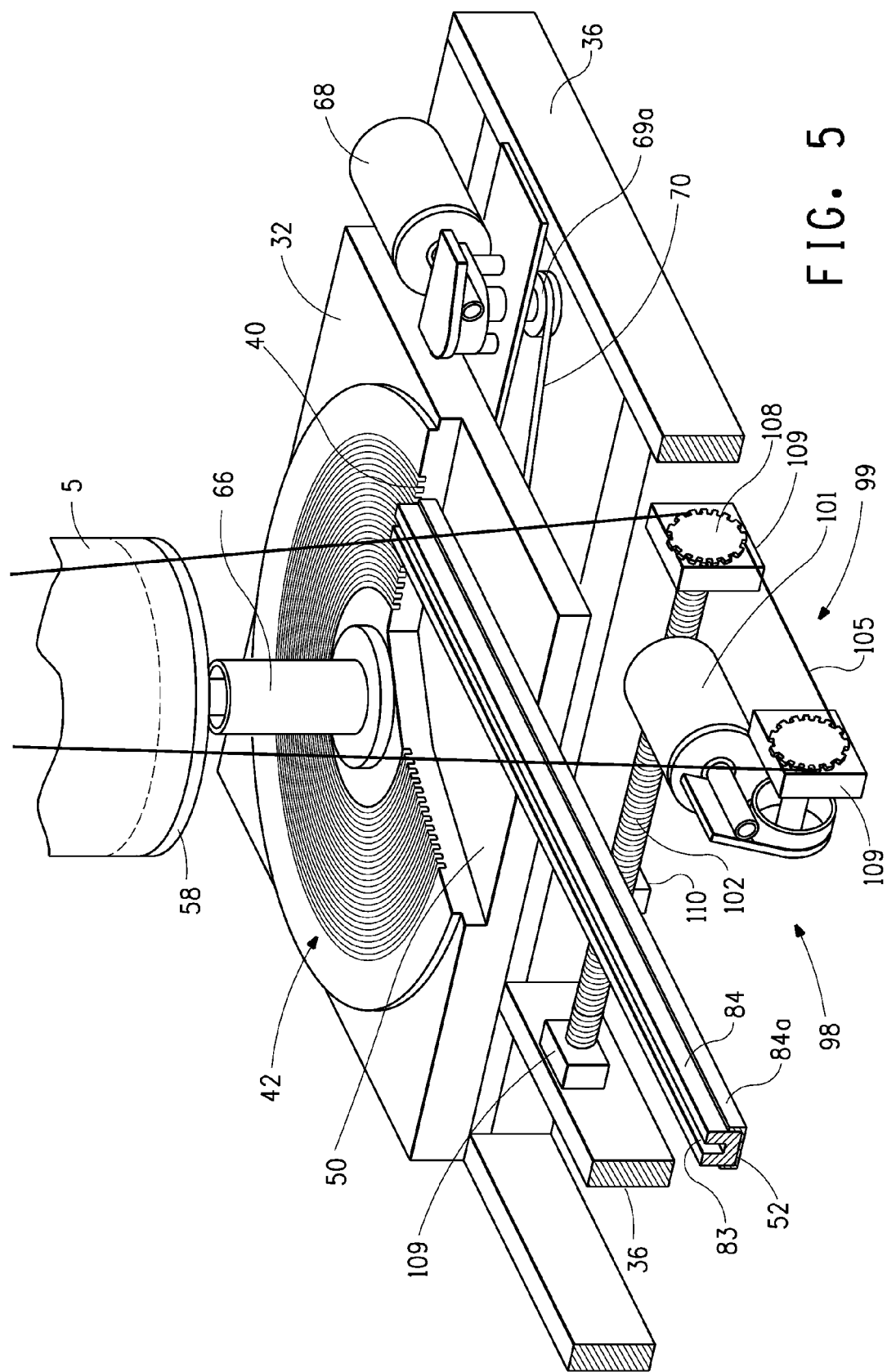
FIG. 5 is a schematic perspective back view of the exposure apparatus, taken along section line 5-5 of FIG. 2, with the housing and plurality of light tubes removed, and showing one embodiment of the means for transferring the plurality of light tubes to one circular rail of a plurality of circular rails.
Figure 6:
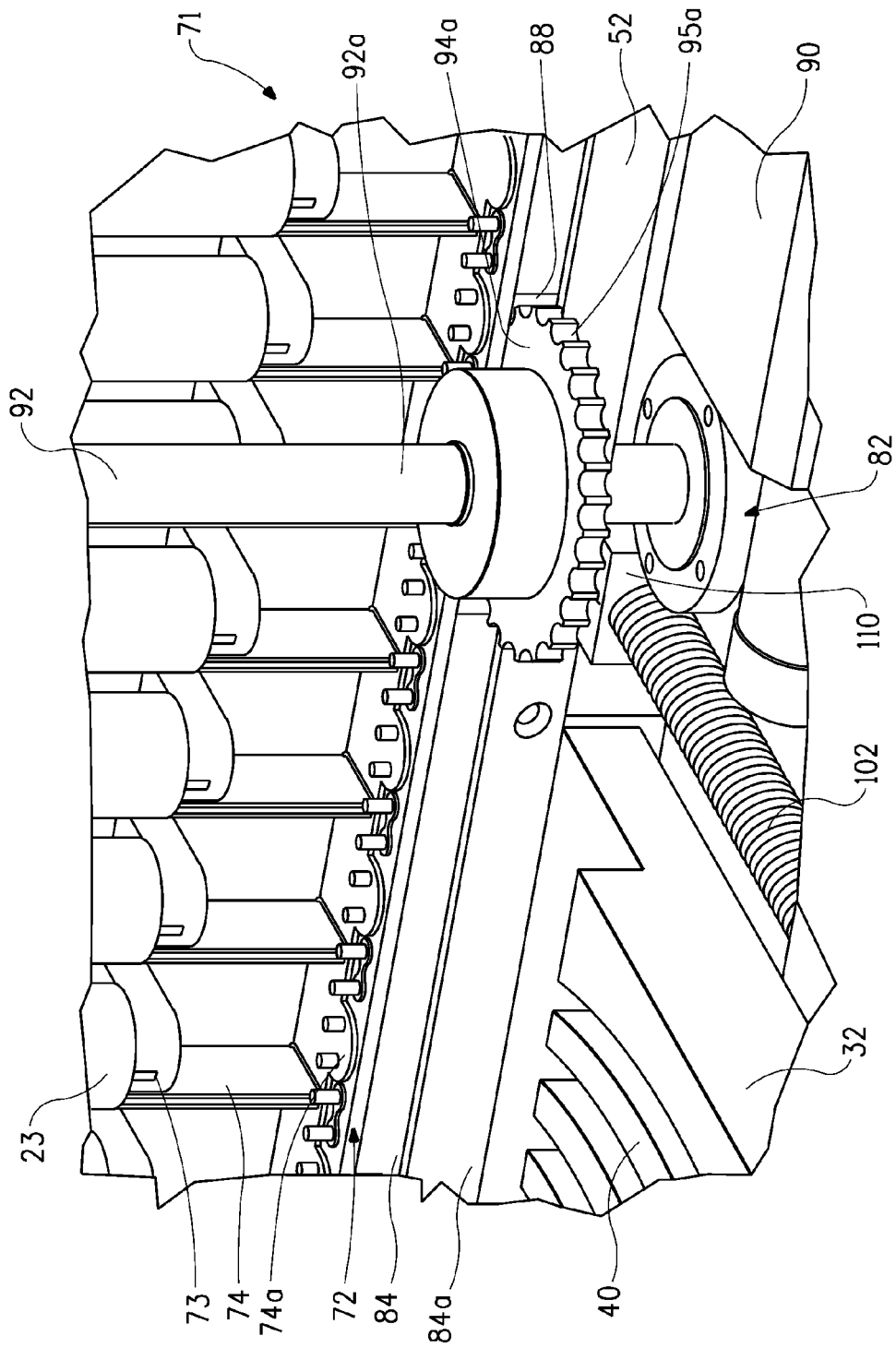
FIG. 6 is a schematic cutaway and close-up perspective front view of a bottom portion of one embodiment of the means for positioning the plurality light tubes along the circular rail, in which the plurality of light tubes is movably fastened to a chain that resides in a bottom rail and meshes with a rotatable sprocket wheel.

As shown in FIGS. 2, 3, and 5, one embodiment of a transferring assembly 99 for the means for transferring 98 the plurality of light tubes 24 to the open end 46 of one circular rail 40 includes a third motor 101 coupled to a bottom spindle 102 and a top spindle 103 by a transport chain 105. The bottom spindle 102 and the top spindle 103 may also be referred to herein as a bottom screw shaft 102 and a top screw shaft 103. The bottom spindle 102 and its coupling to the bottom rail 52 are mirrored in the top spindle and the top rail 55. At one end of the bottom spindle 102 is attached a toothed sprocket 108 for engaging links of the transport chain 105. The bottom spindle 102 is mounted adjacent the recessed portion 50 of the base 32 on blocks 109 secured to the frame 36. In the embodiment shown, the bottom spindle 102 has a threaded surface that engages with a threaded bore of a bottom transport block 110 mounted onto the bottom spindle. Similarly at the top side 35 of the apparatus 10, the top spindle 103, has a toothed sprocket 112 to engage links of the transport chain 105, and is mounted adjacent the recessed portion 54 of the top 34 on blocks 109 secured to the frame 36. The top spindle 103 has a threaded surface that engages with a threaded bore of a top transport block (not shown) mounted to the top spindle. The bottom transport block 110 can be attached to the bottom rail 52, and the top transport block can be attached to the top rail 55, by any suitable means. In one embodiment, the rails 52, 55 can be directly attached to the transport block 110 with, for example screws. In another embodiment, the rails 52, 55 can be attached to the transport block 110 with a bracket member bolted to the respective transport block and the rail. The rotation of the bottom spindle 102 and the top spindle 103 are synchronized via the transport chain 105. The spindles 102, 103 can rotate clockwise and counter-clockwise as appropriate (with the threading orientation on the spindles) to move the first end 52a of the bottom rail 52 and the first end 55a of the top rail 55 along the recessed portion 50, 54 in a direction suitable to reach the open end 46, 47 of the desired or predetermined circular rail 40, 44. The second end 52b of the bottom rail 52 and the second end 55b of the top rail 55 are each pivotally connected to the frame 36 such that the first end 52a, 55a of each rail 52, 55 has sufficient freedom to move across the recessed portions 50, 54 without binding the rails 52, 55. Since the first end 52a of the bottom rail 52 is adjacent the open end 46 of the circular rail 40, and the first end 55a of the top rail 55 is adjacent the open end 47 of the circular rail 44, the first end 52a of the bottom rail 52 and the first end 55a of the top rail 55 transport along a path orthogonal to the open ends 46, 47 of their respective circular rails 40, 44 when the spindles 102, 103 rotate. An alternate embodiment is contemplated in which the second end of each of the bottom rail and the top rail are not pivotally connected to the frame of the apparatus, and instead the second end of the rails can be mounted so as to move with the front end of the rails, that is, an entire length of both rails move in parallel with the transferring of the front end to the circular rail. In this embodiment, the second end of the rails could be mounted to another spindle in the same or similar manner as the front end, or other such mechanism, and synchronized to move with the first end.

In operation, the plurality of light tubes 24 is transferred to the open end 46, 47 of a predetermined circular rail 40, 44 of the plurality of concentric rails 42, 43 by moving the first end 52a of the bottom rail 52 on the bottom threaded spindle 102 and the first end 55a of the top rail 55 on the top threaded spindle 103. The third motor 101 is energized to rotate the transport chain 105. The toothed sprocket 108 on the bottom spindle 102 and the toothed sprocket 112 on the top spindle 103 mesh with links in the transport chain 105, rotating the bottom spindle 102 and the top spindle 103. The rotation of the bottom and top spindles 102, 103 moves the respective transport block 110, 111 along its spindle transferring the bottom rail 52 and the top rail 55 along the recessed portion 50, 54 of the base 32 and top 34. As the spindles 102, 103 rotate, the first end 52a of the bottom rail 52 transfers or slides along a path orthogonal to the open end(s) 46 of the plurality of concentric rails 42 of the base 32 and the first end 55a of the top rail 55 transfers or slides along a path orthogonal to the open end(s) of the plurality of concentric rails 43 of the top 34 until the first ends 52a, 55a are at the open end 46, 47 of the predetermined circular rail 40,44. When the first end 52a of the bottom rail 52 is adjacent the open end 46 of the circular rail 40 of the base 32, the channel 83 of the track 84 in the bottom rail 52 aligns with (a groove of) the circular rail 40 of the base 32. Similarly at the top side 35 of the apparatus 10, when the first end 55a of the top rail 55 is adjacent the open end 47 of the circular rail 44 of the top 34, the channel 85 of the track in the top rail 55 aligns with (the groove of) the corresponding circular rail 44 of the top 34.

In an alternate embodiment of the transferring assembly 99, the means for transferring 98 the plurality of light tubes to the open end of one circular rail can include a positional motor, such as a stepper motor or servo motor, which can determine the position of the first end of the bottom rail and/or the top rail relative to each circular rail of the plurality of circular rails. In this embodiment, the transport motor and transport chain can be replaced with a stepper motor or servo motor that is synchronized with the rotation of the bottom spindle and the top spindle. Other embodiments of synchronizing the motion of the bottom spindle to the top spindle are also contemplated, including the use of a timing belt, gear drives, and linkage mechanisms.

One or more sensors can be mounted in the exposure apparatus along or adjacent each of the bottom rail and the top rail to determine the position of the rails, and/or on one or more components of the light tube assembly to determine the position of the plurality of light tubes. In one embodiment, a cord of a cord sensor is connected to the bracket of the light tube that is the last to enter the circular rail in the exposure location. As the cord of the cord sensor extends or contracts with the movement of the plurality of light tubes, the sensor determines the location of the light tubes and provides feedback to a computer associated with the present apparatus to control the motor/s. In another embodiment, a cord of a cord sensor is connected to the front end of the bottom rail. As the cord of the cord sensor extends or contracts with the movement of the front end of the rail along the recessed portion, the sensor determines the location of the front end relative to the open end of the circular rail and provides feedback to the computer to control the third motor of the transport assembly. One or more sensors also can be used in the present apparatus to detect the print sleeve and/or determine outer diameter and/or a distance from the exterior surface of the print sleeve to a reference location (or to one or more of the plurality of light tubes). One or more sensors can also be used to determine temperature at one or more locations in the interior environment of the present exposure apparatus, and/or to determine a temperature of one or more the light tubes of the plurality of light tubes. The type of sensor/s used is not limited, and can include, for example, cord sensors, infrared sensors, ultrasonic sensors, light barrier sensors, mechanical switch sensors, and triangulation sensors with a laser or a laser beam light barrier.

The plurality of light tubes 24 is composed of a plurality of light tube assemblies 72, each of which includes the light tube 23 mounted between two sockets 73 in the bracket 74. The light tube 23 may also be referred to herein as a lamp 23. The light tubes or lamps 23 emit radiation at the wavelength or range of wavelengths needed for photoreaction of the photosensitive composition on the print sleeve, which is oftentimes referred to as actinic radiation. Each light tube assembly 72 further includes a ballast to at least provide the necessary voltage to start the lamp, and may also be used to stabilize or maintain current through the lamp. The type of ballast is not limited, and can include for example, electronic and electromagnetic. In most embodiments, the ballast is electronic ballast. Optionally, each light tube assembly may include a transformer for pre-heating a coil in the lamp. In one embodiment, a transformer is mounted on a side of the bracket opposite the light tube, i.e., a backside of the bracket, and is connected to the socket. The ballast is used to start and for the operation of the lamp. The preheating of the coil of the lamp by the optional transformer typically increases the operational lifetime of the lamp, i.e., extending the time at which the lamp provides the desired radiation output. Some ballasts may also provide the functionality of the transformer and preheat the coil.

In one embodiment of the exposure apparatus 10, each lamp 23 or light tube in the plurality of light tubes 24 can emit radiation at the same or substantially the same wavelength or wavelength range. In this embodiment, for example, each lamp in the plurality of light tubes may emit ultraviolet radiation at wavelengths in the range of 310 to 400 nm (which may be sometimes be referred to as ultraviolet-A radiation, (UV- A)). This embodiment is particularly useful for main exposing the print sleeve (through the integrated mask), and can also be useful for post-exposing the print sleeve to complete the photopolymerization process (after relief is formed). In an alternate embodiment of the exposure apparatus, the plurality of light tubes can include at least two types of lamps, wherein each type of lamp emits radiation at a different wavelength or range of wavelengths. In this alternate embodiment, for example, one type of lamp in the plurality of light tubes may emit ultraviolet radiation at wavelengths in the range of 310 to 400 nm (UV-A), and another type of lamp in the plurality of light tubes may emit ultraviolet radiation at wavelengths in the range of 200 to about 300 nm, which may be referred to as ultraviolet-C radiation (UV-C)). In most embodiments, the two types of lamps would be in alternating positions along the wall of the plurality of light tubes. This embodiment is particularly useful for combining the steps of post-exposure and finishing exposure of a print sleeve that has already been treated to form the relief surface, in which post-exposure completes the polymerization process, and the finishing exposure is used to detackify the relief surface of the print sleeve.

In the present exposure apparatus 10, any source of radiation can be used for exposing the print sleeve 5. In most embodiments, the source of actinic radiation is in the form of tubular lamps. In most embodiments, the light tubes are fluorescent lamps that include materials which emit sufficient actinic radiation at the wavelength needed for photoreaction of the photosensitive composition on the print sleeve. In some other embodiments, the light tubes can be high-pressure or medium-pressure metal halide lamps. The number of light tubes in the plurality of light tubes is not particularly limited provided that there are a sufficient number of light tubes to substantially surround the print sleeves in each circular rail of the plurality of concentric rails at the exposure station 45. In some embodiments, the number of light tubes in the plurality of light tubes is from five to fifty. In other embodiments, the number of light tubes in the plurality of light tubes is from seven to thirty. In yet other embodiments, the number of light tubes in the plurality of light tubes is eighteen to twenty-six. In most embodiments, all lamps in the plurality of light tubes 24 are energized to emit radiation during exposure, even if less than all the lamps reside in the circular rail for the exposure of the print sleeve. Energizing all the lamps for every exposure assures that all lamps in the plurality of lamps age at the same rate, and thus that the quality of the exposure on print sleeves is consistent for an extended time of operation of the apparatus. In other embodiments, only those lamps of the plurality of light tubes that reside in the circular rail are energized to emit radiation during exposure. In yet other embodiments, only those lamps that reside in the circular rail and one or more of the lamps that are adjacent or near the open end of the circular rail are energized to emit radiation during exposure. In most embodiments, each lamp of the plurality of light tubes has power between 60 to 140 watts. In one embodiment, each lamp of the plurality of light tubes has a length at least as long as the axial length of the print sleeve. In most embodiments, the lamps of the plurality of light tubes have a length that is longer than the axial lengths of the print sleeves that can be exposed by the present apparatus. A suitable lamp for the plurality of light tubes is a 100 Watt fluorescent lamp, Model No. TL100W-10-R SLV (made by Philips Corp., from Amsterdam, Netherlands). In most embodiments, the plurality of light tube assemblies can be at a distance of about 0.5 to about 6.0 inches (about 1.0 to about 15 cm) from the exterior surface of the print sleeve. In some other embodiments, the plurality of light tube assemblies can be at a distance of about 1 to about 15 inch (about 2.54 to 38.1 cm). The exposure time may vary from a few seconds to minutes, depending upon the intensity and spectral energy distribution of the radiation, the distance of the plurality of light tubes from the print sleeve, and the nature and thickness of the photopolymerizable material on the print sleeve.

In some embodiments, in order to assure consistent quality of exposure, i.e., the radiation emitted by the plurality of light tubes is consistent, for a single exposure of a print sleeve, as well as for one exposure of a print sleeve to another exposure of a different print sleeve, i.e., for exposures of multiple print sleeves over a period of time, each lamp of the plurality of light tubes is maintained at a constant or substantially constant temperature, or within a temperature range. By maintaining each lamp of the plurality of light tubes at a constant or substantially constant temperature, or temperature range, aids in providing consistent quality of radiation emitted for each exposure, and in extending the lifetime of the lamps. In some embodiments, each lamp of the plurality of light tubes should be maintained between 35 to 75° C. In most embodiments, each lamp should be maintained at less than 60° C., and in particular from 38 to 60° C. The temperature of each lamp of the plurality of light tubes can be measured by one or more contact or infrared sensors. In some embodiments, the temperature of only one lamp is measured which is representative of the temperature of each of the lamps in the plurality of light tubes.

In addition to maintaining relatively constant the temperature of the lamps in the plurality of light tubes, in most embodiments the quality of exposure is also aided by maintaining the print sleeve at a constant or substantially constant temperature, or within a temperature range. The temperature of print sleeve can be taken at any location on the print sleeve, including the interior surface (i.e., support side) and/or the exterior surface, and can be measured by one or more infrared sensors. Generally, the cooler the temperature at which the print sleeve is maintained, the better for the quality of the relief image. In some embodiments, the temperature of the print sleeve during exposure is maintained at less than 50° C. In other embodiments, the temperature of the print sleeve during exposure is maintained between 20 to 50° C.

The plurality of light tubes when energized typically generates heat, which particularly in an enclosed environment interior to the exposure apparatus can influence the temperature of the lamps as well as the print sleeve. So much heat may be generated by the lamps that the lamps and/or the print sleeve overheat, and it can become difficult to maintain the temperature of the lamps and/or the print sleeve within the desired temperature range. It is desirable to maintain the temperature constant from lamp to lamp within the plurality of light tubes, as well as along the axial length of each of the lamps, and avoid relatively hot or cool regions in the lamps and from lamp to lamp. Similarly it is also desirable to maintain the temperature constant on the print sleeve, and avoid relatively hot or cool regions on the print sleeve. In addition the exposure apparatus may have one or more regions in the interior environment that are hotter or cooler than other regions, which can further impact the quality of the exposure to the print sleeve. The interior environment of the circular exposure apparatus has a temperature that is maintained less than 46° C. In particular, it is important to maintain the temperature of the interior environment and/or the print sleeve because increasing temperatures can influence oxygen inhibition of photopolymerization of the print sleeve during exposure, which can detrimentally impact the shape of the raised elements, i.e., dots, in the relief image. In most embodiments, it is desirable that the present exposure apparatus also include a thermal management system as a means for maintaining one or more conditions of the interior environment of the exposure apparatus constant or relatively constant within a suitable range for exposing the print sleeve. In one embodiment, the thermal management system can be used to assure the condition that at least the lamps are maintained in the desired temperature range during exposure. In addition in other embodiments, the thermal management system can also be used to assure that the print sleeve is maintained within the desired temperature range along with the maintaining the lamps at the desired temperature range.

The thermal management system includes one or more of the following thermal management component assemblies. Not all of the thermal management component assemblies need to function during operation of the exposure unit in order to maintain one or more conditions of the interior environment relatively constant. One or more of the thermal management component assemblies may be functioning at any time during the operation of the exposure apparatus.

A first thermal management component assembly includes a plurality of fans associated with the plurality of light tubes, such that each individual light tube has at least one fan to remove heat generated by the light tube. In most embodiments, each light tube assembly further includes an individual fan at the top end of the bracket which exhausts or pulls air longitudinally from along the lamp. Since the lamps are vertically oriented, and warm air rises to the top end of the lamps, the individual fans on each lamp can help to maintain a relatively constant temperature along the longitudinal axis of the lamp. In some embodiments, each light tube assembly further includes a first fan at the top end of the bracket and a second fan at the bottom end of the bracket which removes air longitudinally from along the axis of the lamp. In most embodiments, the plurality of fans for the light tubes operates continuously during the operation of the exposure apparatus.

A second thermal management component assembly includes one or more circulating fans at the top side of the apparatus, adjacent the home position of the plurality of light tubes. In most embodiments, the one or more circulating fans are horizontally oriented above the top end of the plurality of light tubes to circulate air vertically that is, substantially parallel to the planar wall of the plurality of light tubes at the home location. A sufficient number of the one or more circulating fans are provided to circulate air along the entire wall of the plurality of light tubes at the home position. The number of the one or more circulating fans is dependent upon the number of light tubes in the plurality of light tubes, the length of the wall created by the plurality of light tubes, and a length of the circulating fan/s. The one or more circulating fans circulate air about the plurality of light tube assemblies, mixing warm air that can be trapped at the top side of the apparatus with the cooler air at the bottom side of the apparatus. In most embodiments, the one or circulating fans operate continuously during the operation of the exposure apparatus. In some embodiments, the one or more circulating fans operate when the plurality of light tubes is in the home location and the plurality of light tubes is energized and emitting radiation. In some embodiments, the one or more circulating fans operate when the plurality of light tubes is energized and located on the circular rail.

A third thermal management component assembly includes a fan having a slot nozzle oriented parallel to the longitudinal axis of the print sleeve. The slot nozzle fan is oriented to blow air in the exposure location, and in particular to blow air onto the print sleeve through the gap formed between the leading end 48 of the plurality of light tubes (residing in the circular rail) and the trailing end of the plurality of light tubes (or wall of the light tubes remaining on the bottom and top rails). In most embodiments, the slot nozzle fan has a length at least as long as the largest axial length of the print sleeve that can be exposed in the present apparatus. The slot nozzle fan uses ambient air from the room environment surrounding the exposure apparatus and blows the air onto the exterior surface of the sleeve. Typically, ambient air in the room is at less than 24° C. The slot nozzle fan cools the exterior surface of the print sleeve to maintain the temperature of the print sleeve, and avoids the accumulation of heat between the print sleeve and the substantially circular wall of light tubes that surround the print sleeve. In most embodiments, the slot nozzle fan is operated after the lamps of the plurality of light tubes have reached a minimum temperature, e.g., 38° C., at which maximum output of the lamp occurs.

A fourth thermal management component assembly includes one or more additional circulating fans to circulate air through the exposure apparatus to maintain substantially constant the temperature of the interior, and thereby minimize the interior environment having regions of relatively hot air and relatively cool air. In most embodiments, the one or more additional circulating fans are tangential blowers that are located in the interior on the top side of the apparatus. In most embodiments, the one or more additional circulating fans are operated all the time that the exposure apparatus is in operation.

A fifth thermal management component assembly includes an exhaust blower which collects air from within the exposure apparatus and removes the collected air to an environment external to the exposure apparatus. In most embodiments, the exhaust blower collects the interior air from a location approximately midway between the top side and the bottom side of the exposure apparatus. One or more intake ports can be located throughout the exposure apparatus. In some embodiments, at least one intake port is located in the exposure station. In most embodiments, the exhaust blower is operated all the time the exposure unit is in operation.

Other thermal management systems, as well as thermal management component assemblies are also possible, and are well within the skill of the art to incorporate into the present exposure apparatus.

Operation of the Circular Exposure Unit

For the operation of the circular exposure unit 10, an operator selects the sleeve support 22 that will suitably mate with the cylindrical print sleeve 5 that will be exposed. The print sleeve 5 suitably mates with the sleeve support 22 if the print sleeve 5 can be supported vertically during exposure. The door 15 of the exposure apparatus 10 is opened, and the selected platform 58 is positioned on the plate member 61 that is secured to the shaft 60. At least some of the thermal management component assemblies of the circular exposure unit 10 have been started into operation with a main switch. In most embodiments, the thermal management component assemblies that are operating include the first thermal management assembly, i.e., the plurality of fans associated with the plurality of light tubes; the second thermal management assembly, i.e., one or more circulating fans to circulate air vertically parallel to the plurality of light tubes; the fourth thermal management assembly, i.e., the one or more additional circulating fans for circulating air in the interior of the exposure unit; and, the fifth thermal management assembly, i.e., exhaust blower that collects and removes air from within the unit.

The operation of the method for exposing a cylindrical print sleeve begins with supporting one end 5a of the print sleeve 5 on the sleeve support 22 that is positioned in the center of the base 32 having a plurality of concentric rails 42.

In most embodiments, the print sleeve 5 is mounted vertically on the platform 58, by slip fitting the first end 5a of the print sleeve 5 about the band portion 62 so that the side edge of the print sleeve rests upon the shoulder 64. In the vertical position on the sleeve support 22, the longitudinal axis of the print sleeve 5 is oriented orthogonal to the base 32. Optionally, a sheet or a tube of opaque material can be placed in the hollow or interior space of the print sleeve to prevent actinic radiation transmission through the support and exposing the photopolymerizable layer adjacent the support, i.e., backside exposure. Optionally, the end cover 63 may be positioned on the second end 5b of the print sleeve 5. The door 15 is closed, the operator selects the desired exposure time on a menu via the control panel 26 and presses start. The first motor 68 of the sleeve support assembly 28 is energized, thereby rotating the sleeve support 22 and the print sleeve 5 mounted thereon. The plurality of light tubes 24 begin positioning from the home location 30 on the linear rails (i.e., bottom rail 52 and top rail 55) to the exposure location 45 on the circular rail 40, 44 of the plurality of concentric rails 42, 43. The third motor 101 of the transferring assembly 99 is energized moving the transport chain 105, thereby synchronously transferring the first end 52a of the bottom rail 52 and the first end 55a of the top rail 55 across the recessed portions 50, 54 of the base 32 and the top 34, respectively. A light barrier sensor verifies that the print sleeve 5 is perpendicular to the base 32. If not, a message is sent to the operator via a display of the control panel which indicates that the position of the print sleeve needs to be corrected. The light barrier sensor also detects the exterior surface 5e of the print sleeve 5, and provides this information to a computer (not shown) associated with the exposure unit 10. The computer determines the diameter of the print sleeve 5 and determines which one circular rail 40, 44 of the plurality of concentric rails 42, 43 is selected. In most embodiments, the one circular rail 40, 44 is selected so that the distance between the plurality of light tubes 24 on the circular rail in the exposure location 45 and the exterior surface 5e of the cylindrical print sleeve 5 is constant or substantially constant, that is, the distance between the plurality of light tubes 24 in the predetermined circular rail 40, 44 and the exterior surface 5e of the print sleeve 5 is the same or substantially the same as was used for the exposure of one or more other print sleeves having different diameters. The threaded spindles 102, 103 of the transferring assembly 99 transport the first end 52a of the bottom rail 52 and the first end 55a of the top rail 55 adjacent the open ends 47 of the predetermined circular rail 40 in the base 32 and corresponding predetermined circular rail 44 in the top 34, aligning the channel 83 in the bottom rail 52 and top rail 55 to the groove in the circular rail 40, 44. The second motor 90 of the means for positioning 38 is energized to rotate the rod 92 and sprocket wheels 94a, 94b synchronously moving the chain 78 in the groove of circular rail 40 of the base 32 (and corresponding second chain in the circular rail 44 of the top 34), and thereby positioning the plurality of lamps 24 from the home location 30 to the exposure location 45 on the predetermined circular rail 40, 44. The plurality of light tubes 24 moves into the predetermined circular rail 40, 44 until the leading end 48 of the light tubes reaches the end of the arc of the circular rail, thereby positioning a sufficient number of the plurality of light tubes 24 in the circular rail 40, 44 to substantially surround the print sleeve 5. All the lamps of the plurality of light tubes 24 are energized to emit radiation, and exposing the exterior surface 5e of the print sleeve 5 to actinic radiation for a period sufficient to cause desired photoreaction. The period can be measured in time, or in units based upon measured (ultraviolet) radiation intensity. The temperature of the lamps of the plurality of light tubes is monitored, and after reaching a minimum temperature (at which maximum output of the lamps occurs), the slot nozzle fan of the third thermal management assembly is initiated to blow ambient room air onto the print sleeve 5.

At the end of the exposure period, the lamps remain on while transferring the plurality of light tubes 24 from the exposure location 45 to the home location 30. The rotation of the rod 92 and sprockets 94a, 94b are reversed to return the chains 78 to the bottom and top linear rails 52, 55. During the return to the home location 30, at least all of the lamps that were in the circular rail 40, 44 of the plurality of light tubes 24 pass a photocell which detects if all lamps are operational. When all the lamps of the plurality of light tubes have returned to the home location on the linear rail 52, 55, the lamps are switched off and the rails 52, 55 return to its initial position. The operator opens the door 15, and demounts the print sleeve 5 from the sleeve support 22.

The Print Sleeve (Photosensitive Element)

The print sleeve may be referred to as a photosensitive element. The term "photosensitive" encompasses any system in which the at least one photosensitive layer is capable of initiating a reaction or reactions, particularly photochemical reactions, upon response to actinic radiation. The photosensitive element includes at least one layer of a photopolymerizable composition. As used herein, the term "photopolymerizable" is intended to encompass systems that are photopolymerizable, photocrosslinkable, or both. The photosensitive element is a printing precursor capable of undergoing exposure to actinic radiation and treating, to form a surface suitable for printing. It is contemplated that in some embodiments the printing form resulting from the photosensitive element has end-use printing applications for relief printing, such as flexographic and letterpress printing. Relief printing is a method of printing in which the printing form prints from an image area, where the image area of the printing form is raised and the non-image area is depressed. In some other embodiments, the printing form resulting from the photosensitive element can be suitable for use in gravure or gravure-like printing applications. Gravure printing is a method of printing in which the printing form prints from an image area, where the image area is depressed and consists of small recessed cups or wells to contain the ink or printing material, and the non-image area is the surface of the form. Gravure-like printing is similar to gravure printing except that a relief printing form is used wherein the image area is depressed and consists of recessed areas forming wells to carry the ink which transfer during printing. Throughout this specification actinic radiation will include ultraviolet radiation and/or visible light.

The binder is not limited and can be a single polymer or mixture of polymers. In some embodiments, the binder is an elastomeric binder. In other embodiments, the binder becomes elastomeric upon exposure to actinic radiation. In some embodiments, the binder is an elastomeric block copolymer of an A-B-A type block copolymer, where A represents a non-elastomeric block, and B represents an elastomeric block. The non-elastomeric block A can be a vinyl polymer, such as for example, polystyrene. Examples of the elastomeric block B include polybutadiene and polyisoprene. In some embodiments, the elastomeric binders include poly (styrene/isoprene/styrene) block copolymers, poly(styrene/butadiene/styrene) block copolymers, and mixtures or combinations thereof. It is preferred that the binder be present in an amount of at least 50% by weight of the photosensitive composition.

The photopolymerizable composition contains at least one compound capable of addition polymerization that is compatible with the binder to the extent that a clear, non-cloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Monomers can be appropriately selected by one skilled in the art to provide the photopolymerizable composition with suitable properties. The compound capable of addition polymerization (monomer) is present in at least an amount of 5% by weight of the elastomeric composition.

The photoinitiator can be any single compound or combination of compounds which is sensitive to actinic radiation, generating free radicals which initiate the polymerization of the monomer or monomers without excessive termination. Any of the known classes of photoinitiators may be used. Alternatively, the photoinitiator may be a mixture of compounds, one of which provides the free radicals when caused to do so by a sensitizer activated by radiation. Preferably, the initiator is sensitive to visible or ultraviolet radiation. Photoinitiators are generally present in amounts from 0.001% to 10.0% based on the weight of the photopolymerizable composition.

The photopolymerizable layer can contain other additives depending on the final properties desired. Additional additives to the photopolymerizable layer include spectral sensitizing agents, sensitizers, plasticizers, rheology modifiers, thermal polymerization inhibitors, colorants, processing aids, antioxidants, antiozonants, UV absorber and fillers. The additives should be compatible with the binder and monomer/s.

The thickness of the photopolymerizable layer can vary over a wide range depending upon the type of printing form desired, for example, from about 0.010 inches to about 0.250 inches or greater (about 0.025 cm to about 0.64 cm or greater). In some embodiments, the photopolymerization layer can range from about 0.002 to about 0.067 inch (about 0.005 cm to about 0.17 cm) in thickness.

The support can be any material that is conventionally used with photosensitive elements used to prepare flexographic printing plates or print sleeves. The support may be cylindrically shaped itself, or as was explained above for plates-on-sleeves, may be planar and mounted onto a cylindrical support, or may be planar sheet of a photosensitive plate formed into a cylinder by securing the end edges together by any method. In some embodiments, the support is transparent to actinic radiation to accommodate "backflash" exposure through the support. Examples of suitable support materials include polymeric films such those formed by addition polymers and linear condensation polymers, transparent foams and fabrics. Under certain end-use conditions metals, such as aluminum, may also be used as a support, even though a metal support is not transparent to radiation. A preferred support is a polyester film; particularly preferred is polyethylene terephthalate. The support may be in sheet form or in cylindrical form, which may be referred to as a sleeve, or a sleeve support, or cylindrical support. The type of sleeve support is not limited. The sleeve support may be formed from single layer or multiple layers of flexible material. In some embodiments flexible sleeve supports are made of polymeric films, as they typically are transparent to ultraviolet radiation and thereby accommodate backflash exposure for building a floor in the cylindrical print sleeve. Multiple layered sleeves may include an adhesive layer or tape between the layers of flexible material. An example of a multiple layered sleeve is disclosed in U.S. Pat. No. 5,301,610. The sleeve support may also be made of non-transparent, actinic radiation blocking materials, such as nickel or glass epoxy. In other embodiments, the sleeve support can encompass print sleeve adapters or bridge sleeves which adapt a print sleeve to a print cylinder having a diameter different than the diameter of the print sleeve. The support typically has a thickness from 0.002 to 0.050 inch (0.0051 to 0.127 cm). A preferred thickness for the sheet form is 0.003 to 0.016 inch (0.0076 to 0.040 cm). The sleeve can have a wall thickness from less than 10 mils (0.025 cm) to 80 mils (0.203 cm) or more, but typically has a wall thickness of 10 to 40 mils (0.025 to 0.10 cm). Generally, a preferred wall thickness is dependent upon the desired end-use conditions.

The preparation and formation of cylindrical seamless or substantially seamless photopolymerizable elements is not limited, and may be prepared for example, according to the methods and apparatuses disclosed by Cushner et al. in U.S. Pat. No. 5,798,019 and U.S. Pat. No. 5,916,403; Arimatsu in U.S. Pat. No. 4,337,220; Kitamura et al. in U.S. Pat. No. 4,868,090; Koch et al. in U.S. Pat. No. 4,869,997; Wallbillich et al. in U.S. Pat. No. 4,871,650 and U.S. Pat. No. 4,883,742; Fan et al. in U.S. Pat. No. 6,425,327; and Rossini et al. in U.S. Publication No. U.S. 2002/0069777 A1. A seamless photopolymerizable layer means that the photopolymerizable layer is a continuum of photopolymeric material whereby no line of demarcation or joining of the photopolymeric material as a layer or other defect influencing print quality is present at least on exterior circumferential surface, i.e., printing surfaces, of the element. In some embodiments, the layer of photopolymeric material is continuous throughout the thickness of the layer, i.e., radially from the surface of the support to the exterior surface of the photopolymerizable layer, and along an axial length of the element. An example of a seamless photopolymerizable printing form is disclosed by Fan et al. in EP 0 766 142 A1. In addition, photosensitive elements that are in the form of flat sheets, i.e., and sometimes referred to as plates, can be reprocessed by cutting the element to wrap around a cylindrical support, so that the edges contact, and fusing or joining the edges together to form a continuous cylindrical print sleeve. In some instances, the edges may contact without any gaps or overlapping to join the edges together. In other instances, the edges are joined together with the edges overlapping or forming a gap. In yet another embodiment, the edges of the photopolymerizable flat sheet element can be butt joined by methods including, but not limited to, melt fusing, taping, stitching, clamping, stapling, and gluing, to fuse or join the edges together to form a print sleeve. Depending upon customer needs, after exposure and/or treating of the butt-joined print sleeve, the butt joined portion can be cut away and then mounted as a (planar) plate onto a printing cylinder. Alternatively, the photopolymerizable flat sheet element can be cut to join the opposing edges so that after exposure and treating the resulting print sleeve can be mounted as is onto a printing cylinder (with or without a compressible print adapter sleeve between the printing cylinder and the cylindrical form). Processes for joining the edges of a plate in into a cylindrical form have been disclosed, for example, in German patent DE 28 44 426, United Kingdom Patent GB 1 579 817, and U.S. Pat. No. 4,758,500.

One or more additional layers may be present on top of the photopolymerizable layer, that is, on a side of the photopolymerizable layer opposite the support. Depending on desired use, the additional layers may be opaque or transparent to actinic radiation. They may have one or more functions for the photosensitive element including, but not limited to, an elastomeric layer, a release layer, an actinic radiation opaque layer, a barrier layer, an adhesion modifying layer, and a layer which alters the surface characteristics of the photosensitive element. The additional layer may comprise at least one thermally removable layer on the photopolymerizable layer, such as disclosed by Fan et al. in U.S. Pat. No. 6,773,859 B2. Other suitable layers include those disclosed as elastomeric layers in the multilayer cover element described in U.S. Pat. No. 4,427,759 and U.S. Pat. No. 4,460,675. The photosensitive element can include a wax layer, and/or a barrier layer between an actinic radiation opaque layer and the photopolymerizable layer, or between the actinic radiation opaque layer and the elastomeric layer if present. The photosensitive element optionally includes a temporary cover sheet on top of the outermost layer of the photosensitive element.

In one embodiment the print sleeve includes an actinic radiation opaque layer on or adjacent the photopolymerizable layer or on top of the elastomeric layer if present. The actinic radiation opaque layer can form an integrated photomask on the print sleeve, i.e., photosensitive element, by a digital method of mask formation. The actinic radiation opaque layer may also be referred to as an infrared (IR)-sensitive layer since the layer may have sensitivity to infrared laser radiation, and be capable of blocking actinic radiation. In most embodiments, IR-sensitive layer is opaque to actinic radiation that is, has an optical density$\geq$2.5; can be imaged, preferably by ablating, with an infrared laser. The IR sensitive layer contains material having high absorption in the wavelength (infrared range between 750 and 20,000 nm. In most embodiments, inorganic pigments, such as, for example, carbon black, graphite, etc. is used to absorb the IR radiation. The quantity of infrared absorbing material is usually 0.1-40% by weight, relative to the total weight of the layer. To achieve the optical density of $\geq$2.5 to block actinic radiation, the infrared-sensitive layer contains a material that prevents the transmission of actinic radiation. This actinic radiation blocking material can be the same or different than the infrared absorbing material, and can be, for example, dyes or pigments, and in particular the aforesaid inorganic pigments. The quantity of this material is usually 1-70% by weight relative to the total weight of the layer. The infrared-sensitive layer optionally includes a polymeric binder. Other auxiliary agents, such as plasticizers, coating aids, etc. are possible. In one embodiment, the infrared-sensitive layer may be coated or applied to an exterior surface of the photopolymerizable layer of the print sleeve. The thickness of the infrared-sensitive layer is usually 2 nm to 50 µm, preferably 4 nm to 40 µm. These infrared-sensitive layers and their preparation are described in detail, for example in WO 94/03838 and WO 94/3839.

In an alternate embodiment of digital method of mask formation, the print sleeve, i.e., photosensitive element, will not initially include an infrared sensitive layer. In this case the infrared sensitive layer is the same as or substantially the same as the infrared sensitive layer included with the photosensitive layer as described above. A separate element bearing the infrared sensitive layer will form an assemblage with the photosensitive element such that the infrared sensitive layer is adjacent the surface of the photosensitive element opposite the support, which is typically the photopolymerizable layer. The separate element may include one or more other layers, such as ejection layers or heating layers, to aid in the digital exposure process. The assemblage is exposed imagewise with infrared laser radiation to selectively transfer the infrared sensitive layer and form the image on or disposed above the photopolymerizable layer as disclosed by Fan et al. in U.S. Pat. No. 5,607,814; and Blanchett in U.S. Pat. Nos. 5,766,819; 5,840,463; and EP 0 891 877 A. Only the portions of the infrared sensitive layer which were transferred will reside on the photosensitive element forming the in situ mask.

In another embodiment, the photomask image may be created on a separate carrier and then transferred by application of heat and/or pressure to the surface of the photopolymerizable layer opposite the support. The photopolymerizable layer is typically tacky and will retain the transferred image. The separate carrier can then be removed from the element prior to the pre-exposure and/or the imagewise exposure. The separate carrier may have an infrared sensitive layer that is imagewise exposed to laser radiation to selectively remove the material and form the image. An example of this type of carrier is LaserMask® imaging film by Rexam, Inc.

In yet another embodiment, digital mask formation can be accomplished by imagewise application of the radiation opaque material in the form of inkjet inks. Imagewise application of an ink-jet ink can be directly on the photopolymerizable layer or disposed above the photopolymerizable layer of the photosensitive element.

Imagewise exposure is carried out by exposing the photosensitive element through an image-bearing photomask. In most embodiments, the photomask is integrated with the print sleeve as described above. In most embodiments the integrated photomask is formed on the cylindrical print sleeve (i.e., photosensitive element) by a digital method in which the print sleeve is imagewise exposed to infrared laser radiation to form an integrated photomask on the print sleeve, prior to exposure to actinic radiation by the present exposure apparatus. The integrated photomask may also be referred to as an in-situ mask. The infrared laser exposure can be carried out using various types of infrared lasers, which emit in the range 750 to 20,000 nm. Infrared lasers including, diode lasers emitting in the range 780 to 2,000 nm and Nd:YAG lasers emitting at 1064 nm are preferred. A suitable infrared laser exposure apparatus is disclosed by Fan et al. in U.S. Pat. Nos. 5,654,125 and 5,760,880. In so-called digital imaging, the radiation opaque layer is exposed imagewise to infrared laser radiation to form the image on or disposed above the photopolymerizable layer, i.e., the in-situ mask. The infrared laser radiation can selectively remove, e.g., ablate or vaporize, the infrared sensitive layer (i.e., radiation opaque layer) from the photopolymerizable layer, as disclosed by Fan in U.S. Pat. No. 5,262,275; U.S. Pat. No. 5,719,009; and U.S. Pat. No. 6,238,837. The integrated photomask remains on the photosensitive element for subsequent step of exposure to actinic radiation by the present exposure apparatus. The infrared laser radiation can selectively transfer the infrared sensitive layer to the photopolymerizable layer as described above.

An overall back exposure of the print sleeve through the support may be conducted to polymerize a predetermined thickness of the photopolymer layer adjacent the support. This polymerized portion of the photopolymer layer is often designated a floor. The floor provides improved adhesion between the photopolymerizable layer and the support, helps highlight dot resolution and also establishes the depth of the plate relief. The floor thickness varies with the time of exposure, exposure source, etc. This exposure may be with diffuse or directed radiation. All radiation sources suitable for imagewise main exposure may be used. The exposure is generally for 1-30 minutes. In some embodiments, the overall back exposure is conducted during the manufacture of the (uncured) print sleeve, and thus simplifies the steps necessary for a customer to convert an uncured print sleeve to a print sleeve having a relief surface. In other embodiments, the overall back exposure may be conducted before or after imagewise exposure by a customer. In many embodiments, the overall back exposure of the print sleeve is conducted on a different exposure device that is separate from the present circular exposure apparatus.

The print sleeve is imagewise exposed or blanket exposed, i.e., overall exposed, to actinic radiation in the present exposure apparatus. The print sleeve is exposed by mounting the print sleeve on the sleeve support, positioning the plurality of light tubes in a predetermined circular rail to substantially surround the print sleeve, and energizing the light tubes to emit the actinic radiation. Upon imagewise exposure, the radiation-exposed areas of the photopolymerizable layer are converted to the insoluble state with no significant polymerization or crosslinking taking place in the unexposed areas of the layer.

After the treatment step, the print sleeve can be uniformly post-exposed by the present exposure apparatus to ensure that the photopolymerization process is complete and that the so formed printing sleeve will remain stable during printing and storage. This post-exposure step can utilize the same radiation source as the imagewise main exposure. Furthermore, if the surface of the print sleeve is still tacky, detackification treatments may be applied. Such methods, which are also called "finishing", are well known in the art. For example, tackiness can be eliminated by a treatment of the print sleeve with bromine or chlorine solutions. Preferably, detackification is accomplished by exposure to UV radiation sources having a wavelength not longer than 300 nm. This so-called "light-finishing" is disclosed in European Published Patent Application 0 017927 and U.S. Pat. No. 4,806,506. Various finishing methods may also be combined. In some embodiments, the post-exposure and the finishing exposure are done at the same time on the print sleeve using the present exposure apparatus that has both sources of radiation.

Treatment

Following imagewise exposure to actinic radiation through the mask, the print sleeve is treated to remove unpolymerized areas in the photopolymerizable layer and thereby form a relief image. The treating step removes at least the photopolymerizable layer in the areas that were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerised areas of the photopolymerizable layer. For print sleeves including an IR-sensitive layer for digital formation of the mask, the treating step that forms the relief image in the photopolymerizable layer may also remove the mask image (which had been exposed to actinic radiation).

Treating of the photosensitive element includes (1) "wet" development wherein the print sleeve is contacted with a suitable developer solution to washout unpolymerized areas and/or (2) "dry" development wherein the print sleeve is heated to a development temperature which causes the unpolymerized areas of the photopolymerizable layer to melt or soften or flow and then are removed. Dry development may also be called thermal development. It is also contemplated that combinations of wet and dry treatment can be used to form the relief.

Wet development can be carried out at room temperature but usually is carried out at about 80 to 100° F. The developers can be organic solvents, aqueous or semi-aqueous solutions, and water. The choice of the developer will depend primarily on the chemical nature of the photopolymerizable material to be removed. It is well within the skill of a person in the art to select a suitable solvent developer. Development time can vary based on the thickness and type of the photopolymerizable material, the solvent being used, and the equipment and its operating temperature. Developer can be applied in any convenient manner, including immersion, spraying and brush or roller application. Washout can be carried out in an automatic processing unit which uses a developer and optionally mechanical brushing action to remove the uncured portions of the plate, leaving a relief constituting the exposed image and the floor. Following treatment by developing in solution, the treated print sleeves are generally blotted or wiped dry, and then more fully dried in a forced air or infrared oven. Drying times and temperatures may vary based on equipment design, air flow, and materials.

Treating the print sleeve thermally includes heating the photosensitive element to a temperature sufficient to cause the uncured portions of the photopolymerizable layer to liquefy, i.e., soften or melt or flow, and removing the uncured portions. The layer of the photosensitive composition is capable of partially liquefying upon thermal development. That is, during thermal development the uncured composition must soften or melt at a reasonable processing or developing temperature. If the print sleeve includes one or more additional layers on the photopolymerizable layer, it is desirable (but not necessary) that the one or more additional layers are also removable in the range of acceptable developing temperatures for the photopolymerizable layer. The polymerized areas (cured portions) of the photopolymerizable layer have a higher melting temperature than the unpolymerized areas (uncured portions) and therefore do not melt, soften, or flow at the thermal development temperatures. The uncured portions can be removed from the cured portions of the composition layer by any means including air or liquid stream under pressure as described in U.S. publication 2004/0048199 A1, vacuum as described in Japanese publication 53-008655, and contacting with an absorbent material as described in U.S. Pat. No. 3,060,023; U.S. Pat. No. 3,264,103; U.S. Pat. No. 5,015,556; U.S. Pat. No. 5,175,072; U.S. Pat. No. 5,215,859; U.S. Pat. No. 5,279,697; and U.S. Pat. No. 6,797,454. A preferred method for removing the uncured portions is by contacting an outermost surface of the element to an absorbent surface, such as a development medium, to absorb or wick away or blot the melt portions.

The term "melt" is used to describe the behavior of the unirradiated (uncured) portions of the composition layer subjected to an elevated temperature that softens and reduces the viscosity to permit absorption by the absorbent material. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with development medium can be done at the same time, or in sequence provided that the uncured portions of the photopolymerizable layer are still soft or in a melt state when contacted with the development medium. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the development medium. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the development medium with the photopolymerizable layer that is molten in the uncured regions, a transfer of the uncured photosensitive material from the photopolymerizable layer to the development medium takes place. While still in the heated condition, the development medium is separated from the cured photopolymerizable layer in contact with the support layer to reveal the relief structure. A cycle of the steps of heating the photopolymerizable layer and contacting the molten (portions) layer with the development medium can be repeated as many times as necessary to adequately remove the uncured material and create sufficient relief depth.

Apparatuses suitable for thermally developing the photosensitive element are disclosed by Peterson et al. in U.S. Pat. No. 5,279,697, and also by Johnson et al. in U.S. Pat. No. 6,797,454. The photosensitive element may be placed on a drum or a planar surface in order for thermal treatment to be carried out. An apparatus particularly suitable for thermal developing of cylindrical print sleeves is disclosed by Dudek et al. in U.S. Pat. No. 7,422,840.

The development medium is selected to have a melt temperature exceeding the melt or softening or liquefying temperature of the unirradiated or uncured portions of the radiation curable composition and having good tear resistance at the same operating temperatures. The development medium is selected from non-woven materials, paper stocks, fibrous woven material, open-celled foam materials, porous materials that contain more or less a substantial fraction of their included volume as void volume. The development medium should also possess a high absorbency for the molten elastomeric composition.

We claim:

1. A circular exposure unit for a cylindrical print sleeve having a longitudinal axis including but not limited to:
   a base comprising a plurality of concentric circular rails each circular rail having an open end and disposed substantially around a sleeve support, the sleeve support positioned in a center of the base and adapted to support the print sleeve at one end thereof so that the longitudinal axis is oriented orthogonal to the base; and
   a plurality of light tubes supported in a longitudinal orientation parallel to the longitudinal axis by bottom mounts fastened to means for positioning the light tubes along one of the plurality of circular rails to form a circular wall of tubes, the positioning means supported on a bottom rail having one end thereof positioned adjacent the open end of one of the plurality of circular rails.

2. The exposure unit of claim 1 wherein the means for positioning the light tubes comprises:
   a first chain supported by the bottom rail having links movably fastened to the bottom mounts; and
   means for moving the first chain along the bottom rail and into the open end of one of the plurality of circular rails so that the light tubes may substantially surround the sleeve support.

3. The exposure unit of claim 2 further including but not limited to:
   the open end of each circular rail adapted to receive the first chain when moved along the bottom rail; and
   means for transferring the bottom rail along a path orthogonal to the open ends of the circular rails so that the one end of the bottom rail may be positioned adjacent the open end of a predetermined circular rail.

4. The exposure unit of claim 1 further including but not limited to:
   a top disposed opposite the base and connected thereto, the top comprising a plurality of concentric circular rails corresponding to the plurality of circular rails in the base and each having a corresponding open end;
   the plurality of light tubes supported by individual top mounts at ends of the light tubes opposite the bottom mounts, the positioning means connected to a top rail having one end thereof positioned adjacent the open end of one of the plurality of circular rails of the top.

5. The exposure unit of claim 4 wherein the means for positioning the light tubes further comprises:
   a second chain supported by the top rail having links movably fastened to the top mounts; and
   means for moving the second chain along the top rail and into the open end of one of the plurality of circular rails in the top.

6. The exposure unit of claim 4 further including but not limited to:
   means for transferring the bottom rail and the top rail along a path orthogonal to the open ends of the circular rails of the base and the top so that the one end of the bottom rail may be positioned adjacent the open end of a predetermined circular rail of the base and the one end of the top rail may be positioned adjacent the open end of the corresponding predetermined circular rail of the top.

7. The exposure unit of claim 6 wherein the bottom rail and the top rail are supported within a frame, and wherein the transferring means comprises a screw shaft connected to both the frame and a motor for rotating the screw shaft.

8. The exposure unit of claim 5 wherein the means for positioning the light tubes further comprises:
   a first chain supported by the bottom rail having links movably fastened to the bottom mounts and moved along the bottom rail and into the open end of one of the plurality of circular rails by the means for moving so that the light tubes may substantially surround the sleeve support.

9. The exposure unit of claim 8 wherein the means for moving the first and second chains comprises a shaft connected to a motor for rotating the shaft, the shaft attached to bottom and top sprocket wheels positioned to mesh, respectively, with the links in the first and second chains.

10. A method for exposing a cylindrical print sleeve having a longitudinal axis and an exterior surface, the method including but not limited to:
    supporting one end of the print sleeve on a sleeve support positioned in a center of a base, the base comprising a plurality of concentric circular rails each circular rail having an open end and disposed substantially around a sleeve support;
    supporting a plurality of light tubes in a longitudinal orientation parallel to the longitudinal axis on bottom mounts moveably supported on a bottom rail having one end positioned adjacent the open end of one of the plurality of circular rails;
    moving the mounts along the bottom rail and into the open end of one of the plurality of circular rails so that the light tubes substantially surround the sleeve support; and
    energizing the light tubes to emit actinic radiation onto the exterior surface.

11. The method of claim 10 further comprising rotating the sleeve support.

12. The method of claim 10 further comprising:
    sensing the exterior surface of the print sleeve positioned on the sleeve support;

selecting from the plurality of concentric circular rails a predetermined circular rail; and
- transferring the open end of the bottom rail adjacent to the open end of the predetermined circular rail;
- wherein the light tubes in the predetermined circular rail is at a predetermined distance from the exterior surface of the print sleeve.

13. The method of claim 10 further comprising:
determining a temperature of the print sleeve as actinic radiation impinges the exterior surface;
maintaining the temperature of the print sleeve in a range of 20 to 50° C.

14. The method of claim 10 further comprising blowing air onto the print sleeve.

15. The method of claim 10 wherein the energized light tubes have a temperature, the method further comprising maintaining the temperature of the light tubes in a range of 35 to 75° C.

\* \* \* \* \*